US012764859B2

(12) United States Patent
Nam et al.

(10) Patent No.: US 12,764,859 B2
(45) Date of Patent: Oct. 13, 2026

(54) PRINTED CIRCUIT BOARD

(71) Applicant: LG INNOTEK CO., LTD., Seoul (KR)

(72) Inventors: Il Sik Nam, Seoul (KR); Yong Suk Kim, Seoul (KR); Dong Keun Lee, Seoul (KR); Tae Ki Kim, Seoul (KR); Hye Jin Jo, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 144 days.

(21) Appl. No.: 18/657,331

(22) Filed: May 7, 2024

(65) Prior Publication Data

US 2024/0292534 A1 Aug. 29, 2024

Related U.S. Application Data

(63) Continuation of application No. 17/638,898, filed as application No. PCT/KR2020/011292 on Aug. 25, 2020, now Pat. No. 12,010,795.

(30) Foreign Application Priority Data

Aug. 26, 2019 (KR) ........................ 10-2019-0104541
Aug. 26, 2019 (KR) ........................ 10-2019-0104553
Aug. 26, 2019 (KR) ........................ 10-2019-0104587

(51) Int. Cl.
*H05K 1/11* (2006.01)
*H05K 1/02* (2006.01)

(52) U.S. Cl.
CPC ........... *H05K 1/113* (2013.01); *H05K 1/0256* (2013.01); *H05K 2201/09118* (2013.01)

(58) Field of Classification Search
CPC ................. H05K 1/113; H05K 1/0256; H05K 2201/09118; H05K 3/284; H05K 3/4652;
(Continued)

(56) References Cited

U.S. PATENT DOCUMENTS 8,507,376 B2 8/2013 Ewert et al.
8,587,120 B2 11/2013 Choi et al.
(Continued)

FOREIGN PATENT DOCUMENTS

CN 102842531 12/2012
JP 2002-237500 8/2002
(Continued)

OTHER PUBLICATIONS

Korean Office Action dated Mar. 18, 2025, issued in Application No. 10-2019-0104541.
(Continued)

*Primary Examiner* — Timothy J Thompson
(74) *Attorney, Agent, or Firm* — KED & ASSOCIATES, LLP

(57) ABSTRACT

A printed circuit board according to an embodiment includes an insulating layer; a first pad disposed on an upper surface of the insulating layer; a second pad disposed on a lower surface of the insulating layer; a first device mounted on the first pad; a second device mounted on the second pad; a first molding layer disposed on the insulating layer and molding the first device; and a second molding layer disposed on the lower surface of the insulating layer and molding the second device, wherein a lower surface of the second molding layer is positioned on the same plane as a lower surface of the second device.

17 Claims, 10 Drawing Sheets

(58) Field of Classification Search
CPC ..... H05K 2201/099; H05K 2203/1316; H05K 3/4007; H05K 1/0298; H05K 1/0203; H05K 1/111; H05K 1/112; H05K 1/144; H05K 1/181; H01L 23/12
See application file for complete search history.

(56) References Cited

U.S. PATENT DOCUMENTS

| | | | | |
|---|---|---|---|---|
| 8,800,142 | B2 | 8/2014 | Nang et al. | |
| 8,890,315 | B2 | 11/2014 | Choi et al. | |
| 9,105,532 | B2 | 8/2015 | Choi et al. | |
| 9,196,896 | B2 | 11/2015 | Jung et al. | |
| 9,368,438 | B2 | 6/2016 | Lin et al. | |
| 9,406,599 | B2 | 8/2016 | Suzuki | |
| 9,515,018 | B2 | 12/2016 | Suzuki | |
| 9,673,181 | B2 | 6/2017 | Lin et al. | |
| 9,693,458 | B2 * | 6/2017 | Yoshikawa | H01L 21/4853 |
| 9,748,179 | B2 | 8/2017 | Yoo et al. | |
| 10,134,679 | B2 | 11/2018 | Kim et al. | |
| 10,269,778 | B2 | 4/2019 | Lin et al. | |
| 2005/0017058 | A1 | 1/2005 | Ho et al. | |
| 2005/0255408 | A1 | 11/2005 | Grube | |
| 2007/0218676 | A1 | 9/2007 | Wang et al. | |
| 2008/0185711 | A1 | 8/2008 | Hsu | |
| 2012/0326296 | A1 | 12/2012 | Choi et al. | |
| 2014/0008791 | A1 | 1/2014 | Choi et al. | |
| 2014/0183731 | A1 | 7/2014 | Lin et al. | |
| 2015/0054151 | A1 | 2/2015 | Choi et al. | |
| 2015/0091150 | A1 | 4/2015 | Lin et al. | |
| 2016/0035678 | A1 | 2/2016 | Yoo et al. | |
| 2016/0064319 | A1 * | 3/2016 | Suzuki | H01L 23/49866 174/251 |
| 2016/0284677 | A1 | 9/2016 | Lin et al. | |
| 2016/0307834 | A1 | 10/2016 | Suzuki | |
| 2016/0351506 | A1 | 12/2016 | Kim et al. | |
| 2016/0351543 | A1 | 12/2016 | Ryu et al. | |
| 2017/0186677 | A1 * | 6/2017 | Imafuji | H10W 90/701 |
| 2017/0271311 | A1 | 9/2017 | Lin et al. | |
| 2017/0301632 | A1 | 10/2017 | Yoo et al. | |

FOREIGN PATENT DOCUMENTS

| | | |
|---|---|---|
| JP | 2008-193068 | 8/2008 |
| JP | 2012-064911 | 3/2012 |
| JP | 2015-076465 | 4/2015 |
| JP | 2016-119331 | 6/2016 |
| KR | 10-2008-0012045 | 2/2008 |
| KR | 10-2011-0070987 | 6/2011 |
| KR | 10-2012-0031727 | 4/2012 |
| KR | 10-2014-0013469 | 2/2014 |
| KR | 10-2014-0086812 | 7/2014 |
| KR | 10-2015-0092881 | 8/2015 |
| KR | 10-2015-0092882 | 8/2015 |
| KR | 10-2016-0014913 | 2/2016 |
| KR | 10-2016-0026710 | 3/2016 |
| KR | 10-2017-0059708 | 5/2017 |
| KR | 10-2019-0023561 | 3/2019 |

OTHER PUBLICATIONS

Korean Office Action dated May 20, 2025, issued in Application No. 10-2019-0104587.
Korean Office Action dated Jul. 11, 2024 issued in Application No. 10-2019-0104541.
International Search Report dated Nov. 26, 2020 issued in Application No. PCT/KR2020/011292.
Chinese Office Action dated Aug. 22, 2023 issued in Application No. 202080067239.4.
U.S. Office Action dated Sep. 24, 2023 issued in U.S. Appl. No. 17/638,898.
Korean Office Action dated Nov. 19, 2025 issued in Application No. 10-2025-0005292.

* cited by examiner

【FIG. 1】
PRIOR ART
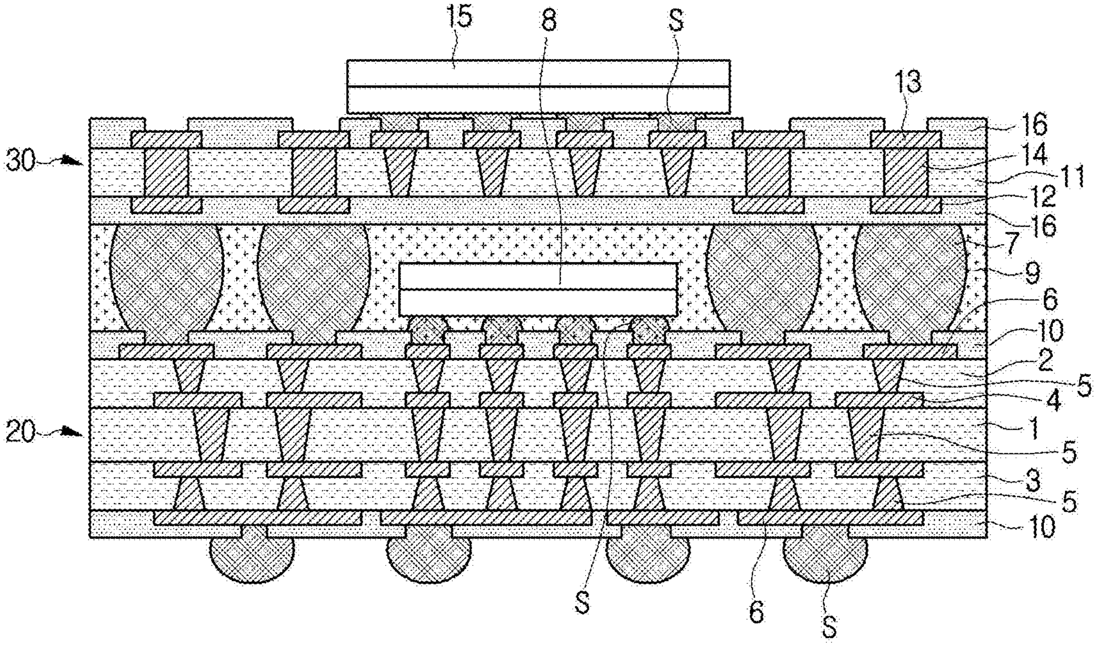
【FIG. 2】
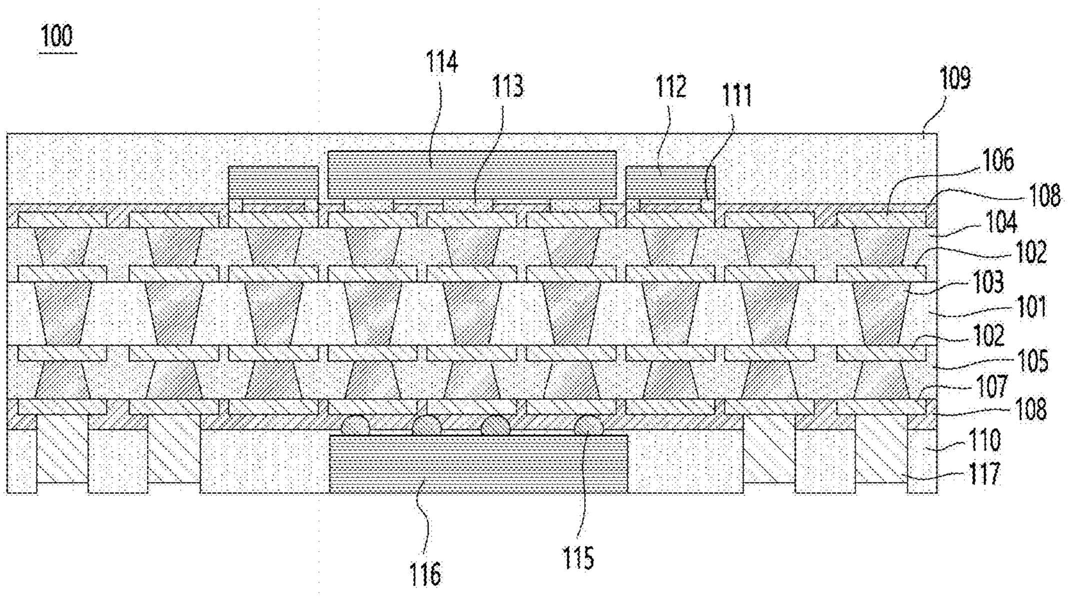

【FIG. 3】
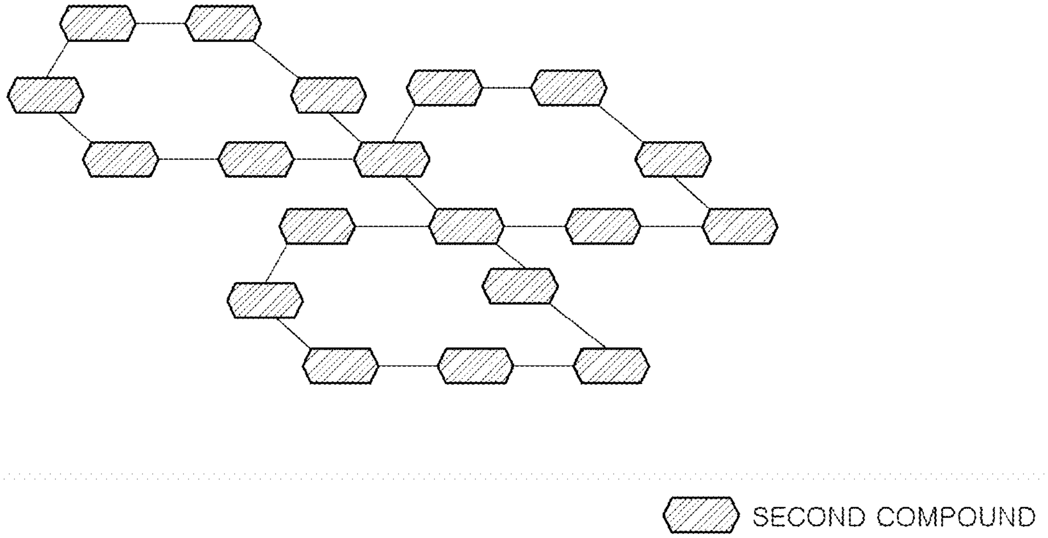
【FIG. 4】
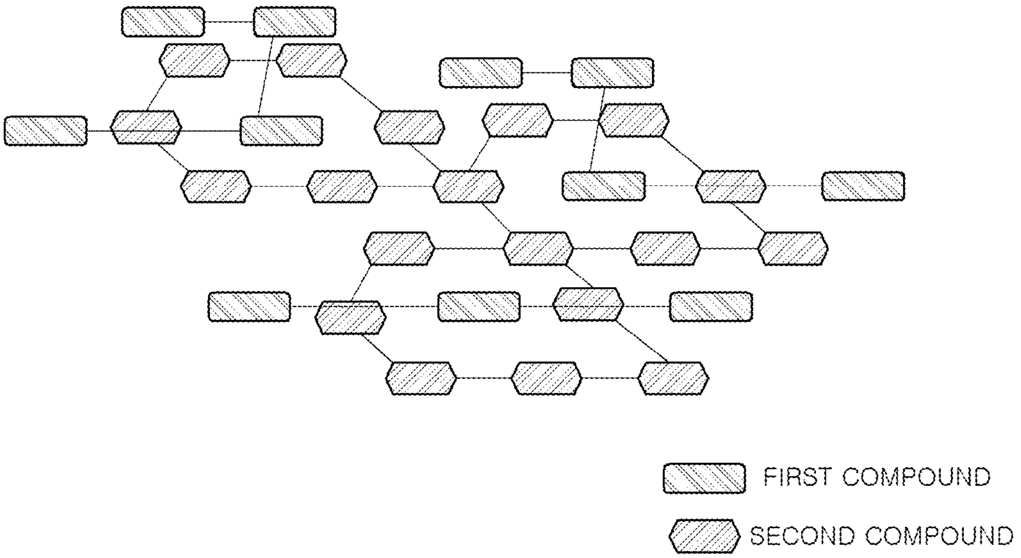

【FIG. 5】 PRIOR ART
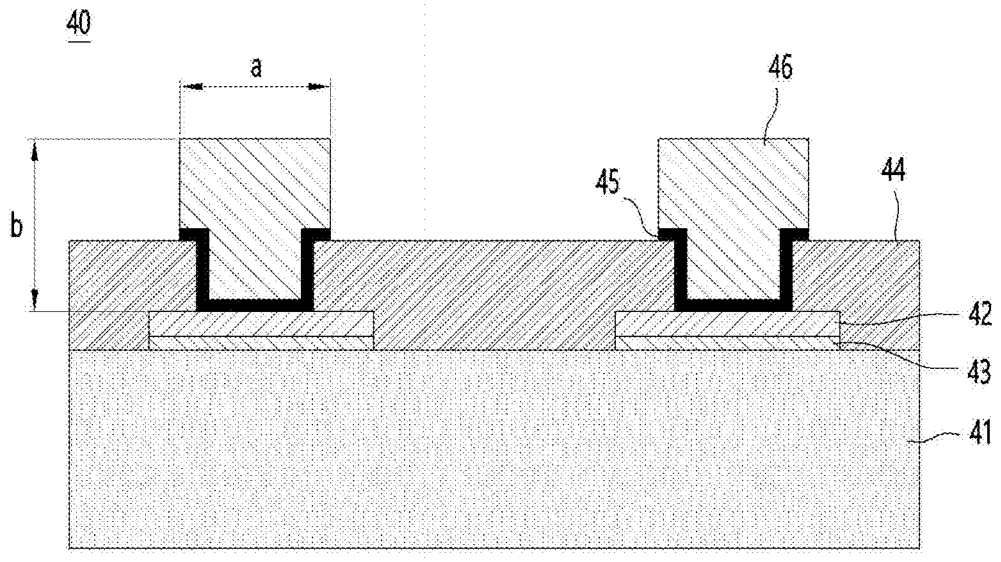
【FIG. 6】
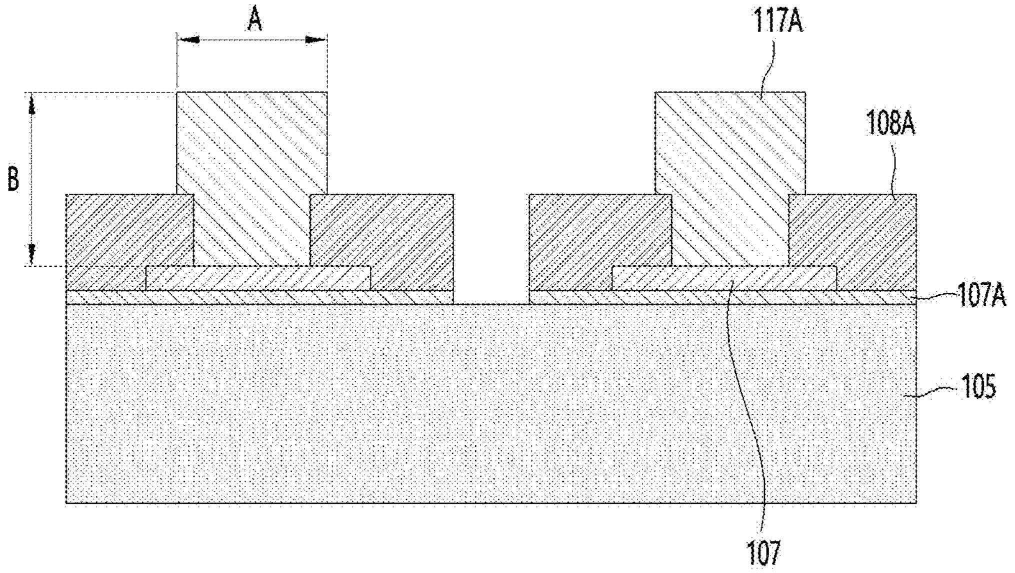

【FIG. 7】
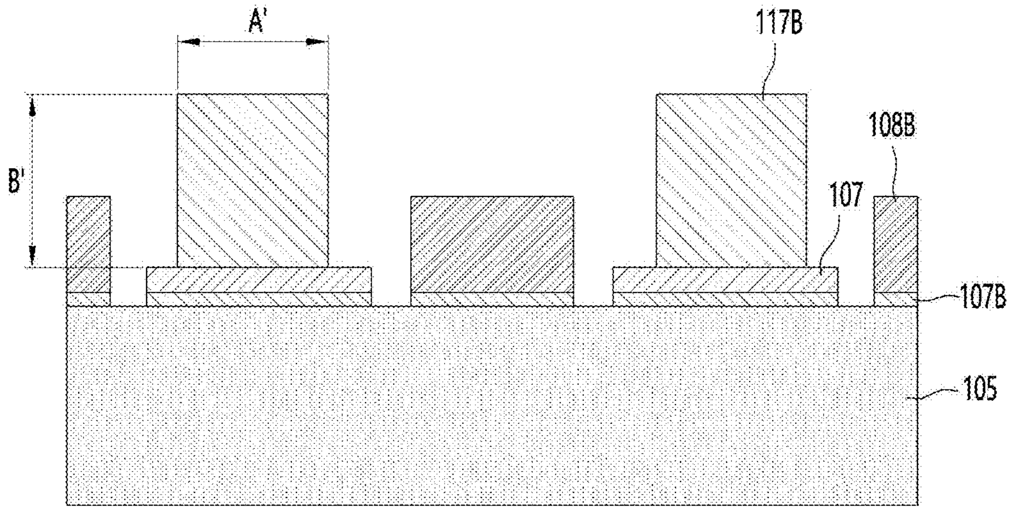
【FIG. 8】
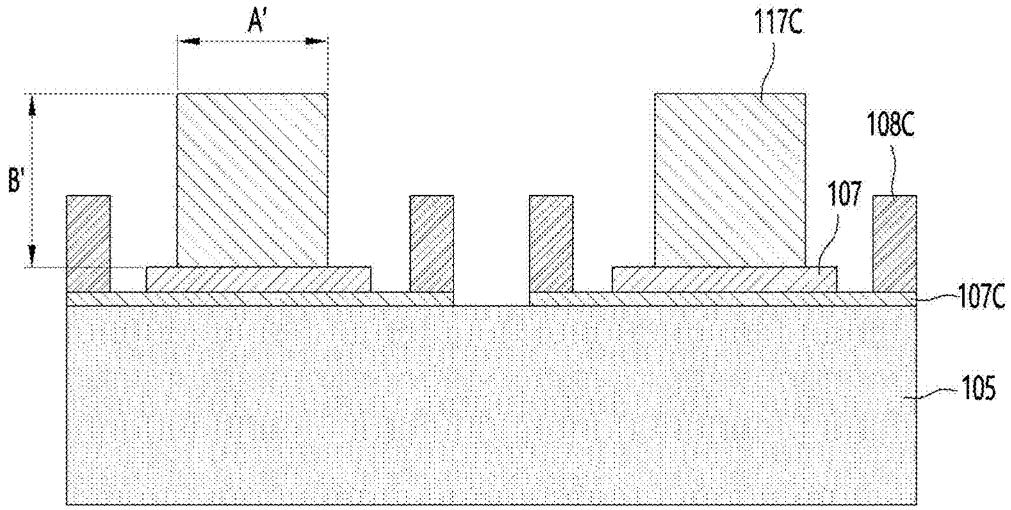

【FIG. 9】
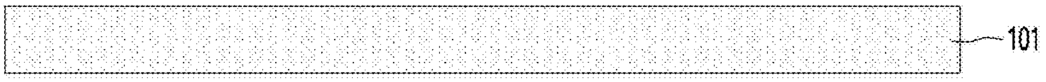
【FIG. 10】
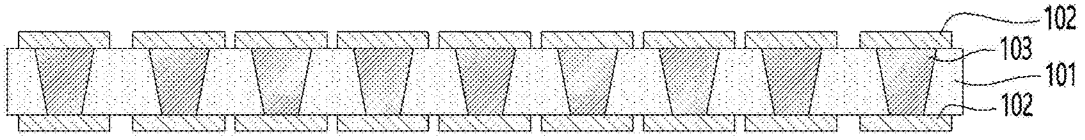
【FIG. 11】
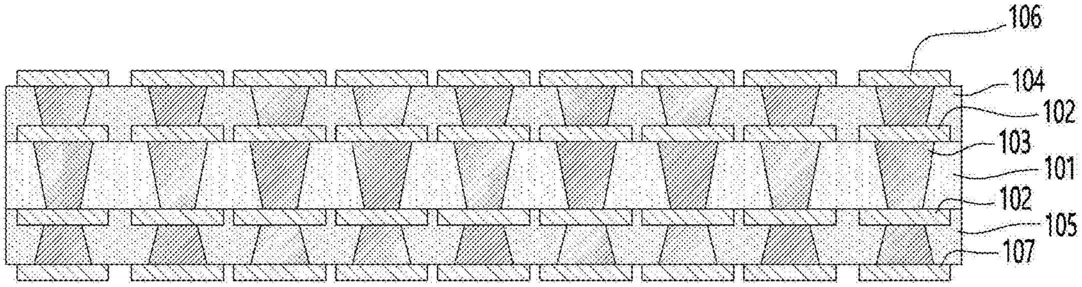

【FIG. 12】
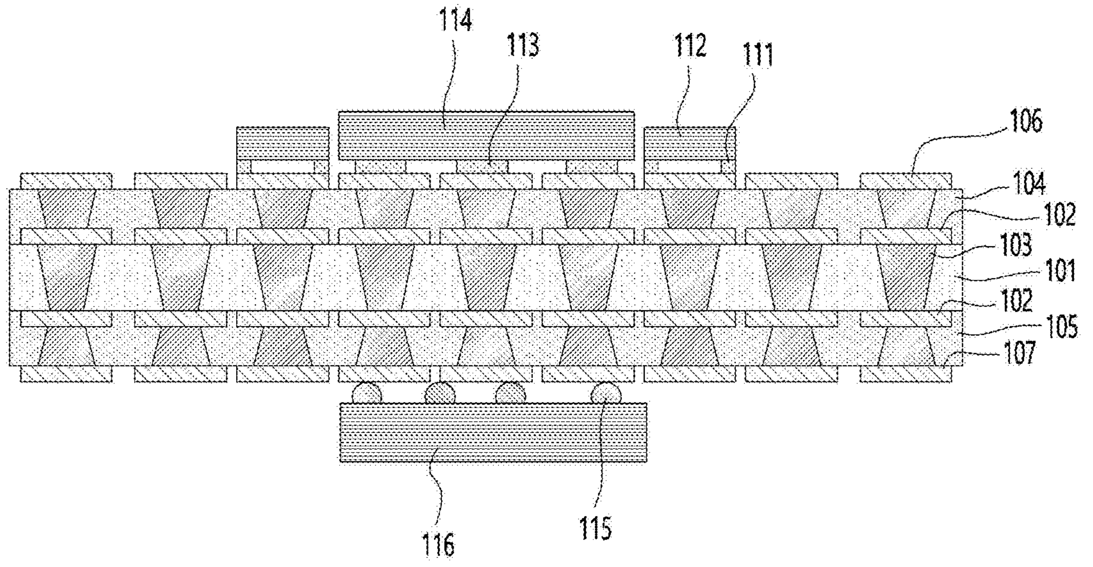
【FIG. 13】
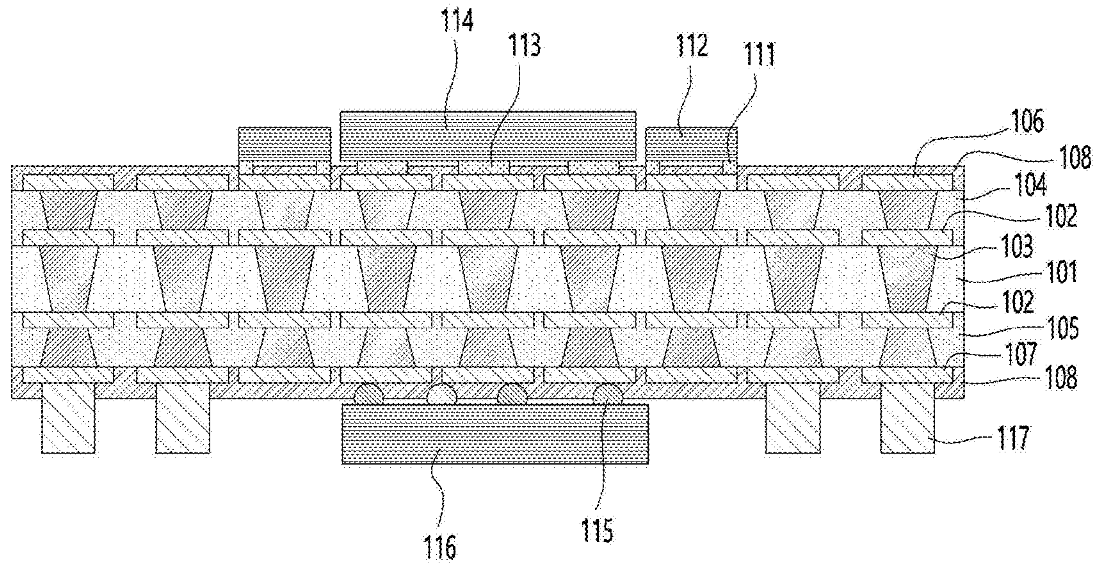

【FIG. 14】
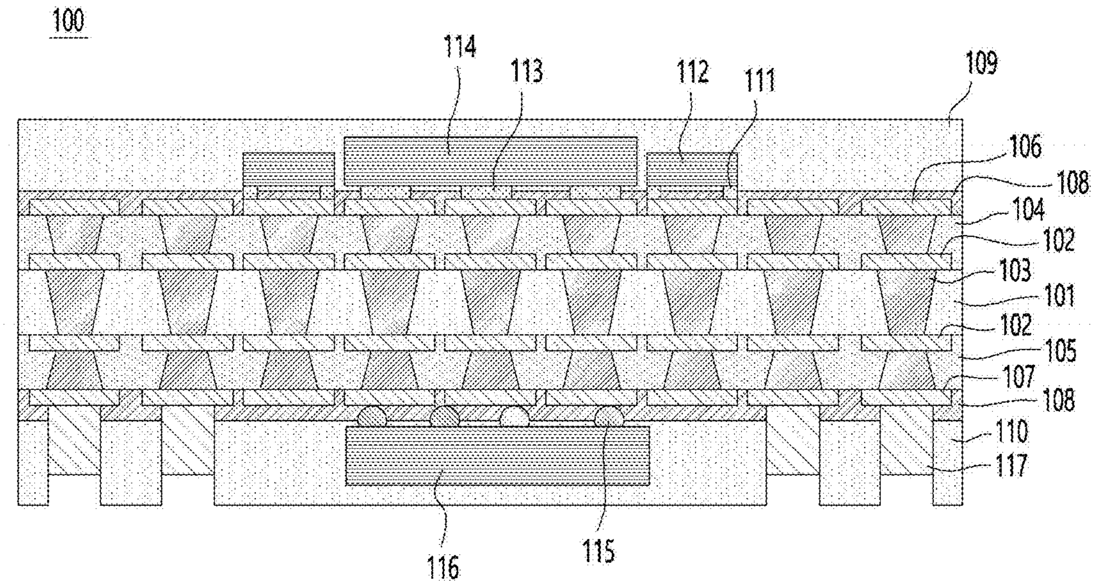
【FIG. 15】
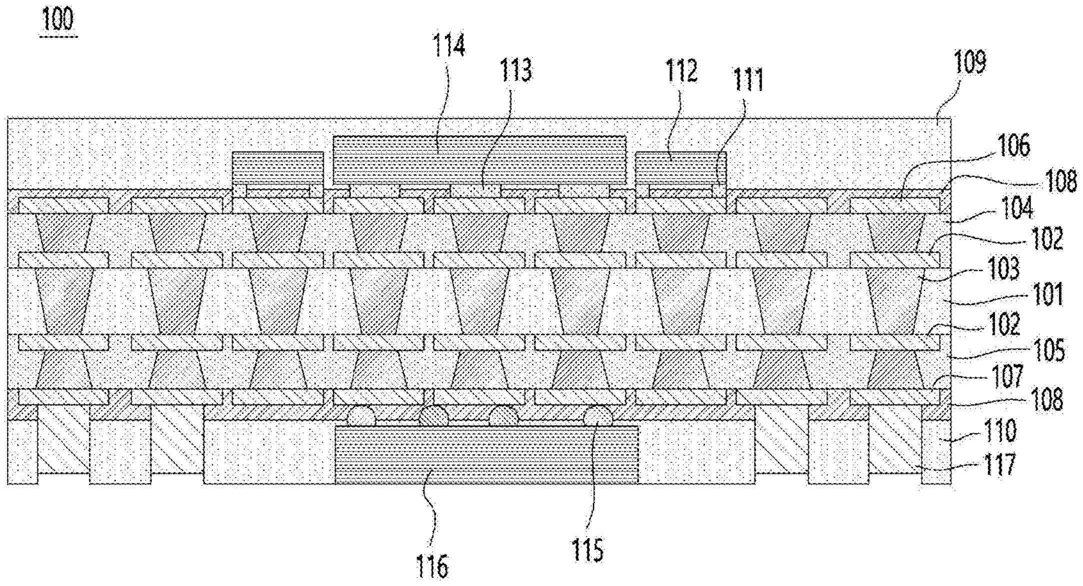

【FIG. 16】
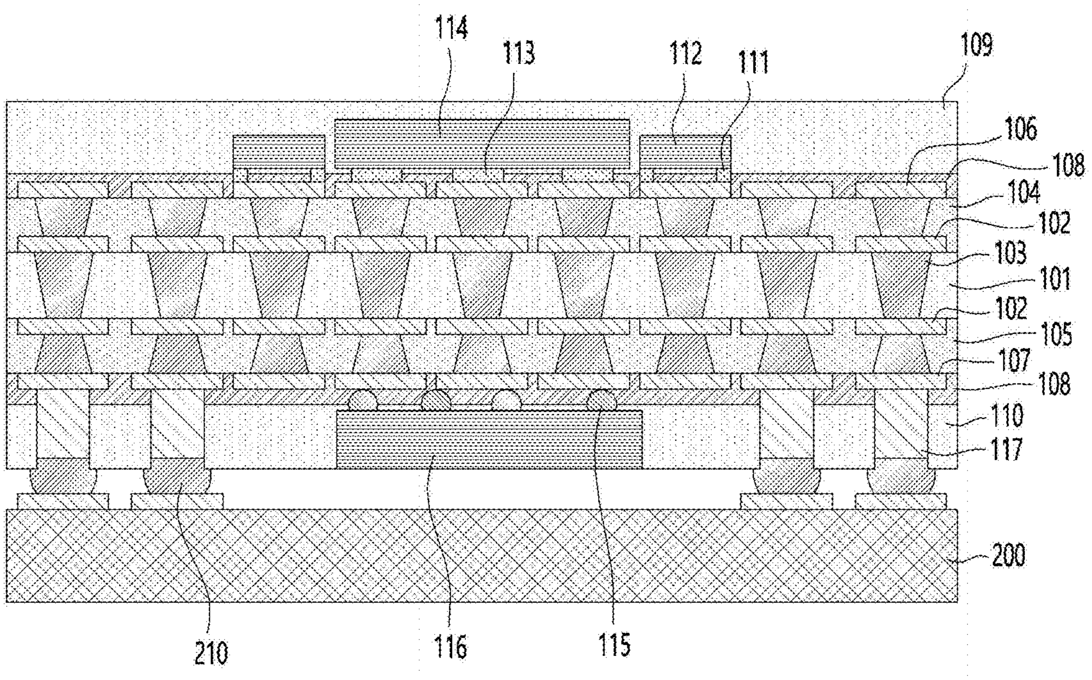

【FIG. 17】
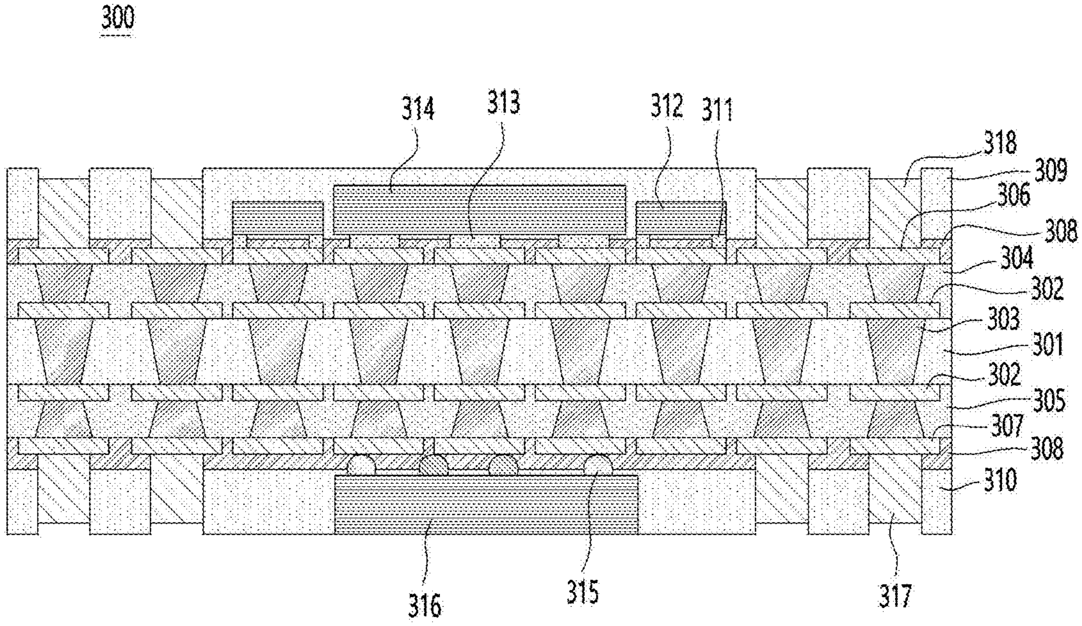

【FIG. 18】
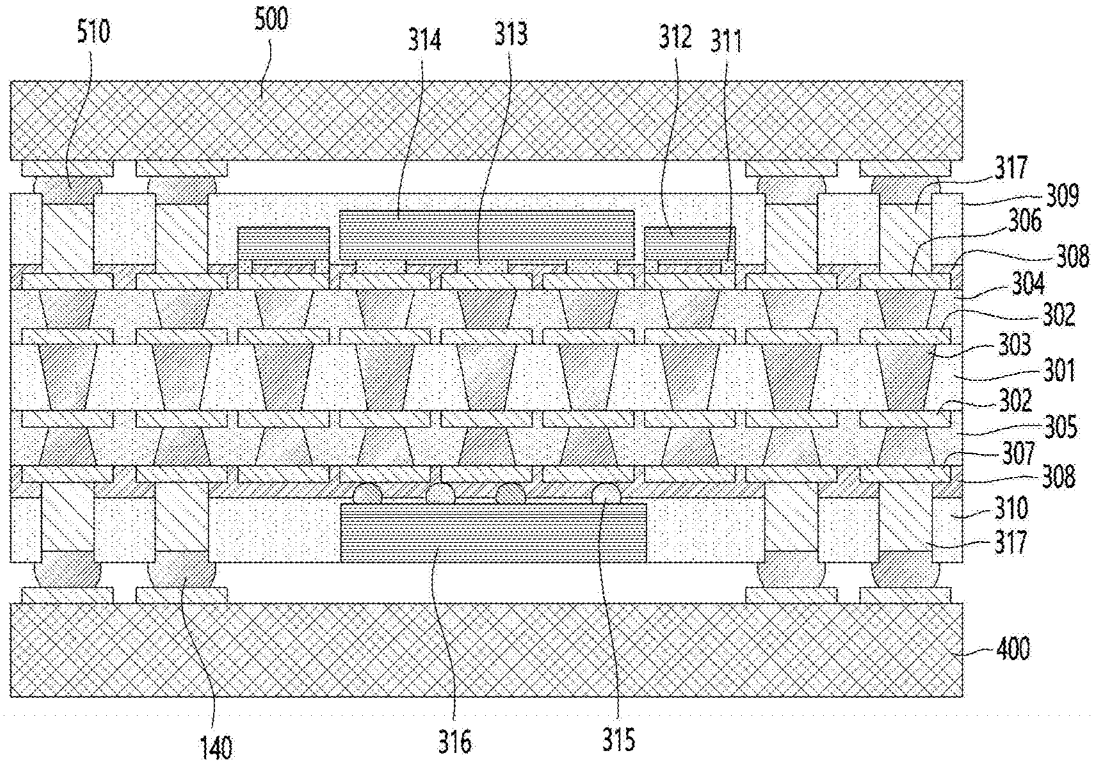

PRINTED CIRCUIT BOARD

CROSS-REFERENCE TO RELATED APPLICATIONS

This application is a continuation of U.S. patent application Ser. No. 17/638,898, filed Feb. 28, 2022, which is a U.S. National Stage Application under 35 U.S.C. § 371 of PCT Application No. PCT/KR2020/011292, filed Aug. 25, 2020, which claims priority to Korean Patent Application Nos. 10-2019-0104587, filed Aug. 26, 2019, 10-2019-0104553, filed Aug. 26, 2019, and 10-2019-0104541, filed Aug. 26, 2019, whose entire disclosures are hereby incorporated by reference.

TECHNICAL FIELD

An embodiment relates to a printed circuit board and a package substrate including the same.

BACKGROUND ART

In general, a package substrate has a structure in which a first substrate to which a memory chip is attached and a second substrate to which a processor chip is attached are connected as one.

The package substrate has advantages in that, by manufacturing the processor chip and the memory chip in one package, the mounting area of the chip can be reduced, and high-speed signal transmission is possible through a short pass.

Due to these advantages, the package substrate as described above is widely applied to mobile devices and the like.

FIG. 1 is a cross-sectional view showing a package substrate according to a prior art.

Referring to FIG. 1, a package substrate includes a first substrate 20 and a second substrate 30 attached on the first substrate 20.

In addition, the first substrate 20 includes a first insulating layer 1, a circuit pattern 2 formed on at least one surface of the first insulating layer 1, a second insulating layer 2 formed on the first insulating layer 1, a third insulating layer 3 formed under the first insulating layer 1, a circuit pattern 4 formed on at least one surface of the first insulating layer 1, a conductive via 5 formed in at least one of the first insulating layer 1, the second insulating layer 2, and the second insulating layer 3, a pad 6 formed on an upper surface of the second insulating layer 2, a plurality of adhesive pastes 7 on the pad 6, a memory chip 8 formed on at least one of the plurality of adhesive pastes 7, a first protective layer 10 formed on the second insulating layer 2 and exposing a part of the upper surface of the pad 6, and a second protective layer 9 formed on the protective layer 10 to cover the memory chip 8.

In addition, the second substrate 30 includes a fourth insulating layer 11, a circuit pattern 12 formed on at least one surface of the fourth insulating layer 11, a pad 13 formed on at least one surface of the fourth insulating layer 11, a conductive via 14 formed in the fourth insulating layer 11, a processor chip 15 formed on the fourth insulating layer 11, and a connecting member (S) connecting the processor chip 15 and the pad 13.

The package substrate according to the prior art shown in FIG. 1 is a schematic diagram of a Package on Package (PoP) to which a TMV (Through Mold Via) technology applied with a laser technology is applied.

In the TMV technology, as described above, a conductive via connected to the pads are formed through a laser process after the first substrate 20 is molded, and thus a solder ball (adhesive paste) are printed in the conductive via.

Then, the second substrate 30 is attached on the first substrate 20 by the printed solder ball 7.

However, the prior art as described above is a method of connecting the first substrate and the second substrate using the solder ball 7, so there is a problem in that there is a limitation in responding to the fine pitch.

In addition, since the prior art uses the solder ball 7 as described above, there is a high possibility that issues such as solder cracks, bridge, and solder collapse may occur.

DISCLOSURE

Technical Problem

An embodiment provides a printed circuit board having a novel structure and a package substrate including the same.

In addition, an embodiment provides a printed circuit board that can easily respond to a fine pitch and a package substrate including the same.

In addition, an embodiment provides a printed circuit board capable of minimizing the occurrence of warpage by maintaining a balance of upper and lower portions, and a package substrate including the same.

In addition, an embodiment provides a printed circuit board capable of improving the reliability of the post bump and a package substrate including the same.

The technical problems to be achieved in the proposed embodiment are not limited to the technical problems mentioned above, and other technical problems not mentioned in the embodiments will be clearly understood by those of ordinary skill in the art to which the embodiments proposed from the description below.

Technical Solution

A printed circuit board according to an embodiment includes an insulating layer; a plurality of first pads disposed on an upper surface of the insulating layer; a plurality of second pads disposed on a lower surface of the insulating layer; a first device mounted on any one of the plurality of first pads; a second device mounted on any one of the plurality of second pads; a first molding layer disposed on the insulating layer and molding the first device; a second molding layer disposed on a lower surface of the insulating layer and molding the second device; a first post bump disposed on any one of the plurality of second pads; and a second post bump disposed on any one of the plurality of first pads.

In addition, the first post bump and the second post bump are symmetrical with respect to the insulating layer.

In addition, a lower surface of the second molding layer is positioned on the same plane as a lower surface of the second device, and an upper surface of the first molding layer is positioned higher than an upper surface of the first device.

In addition, the printed circuit board further includes a first protective layer disposed between the upper surface of the insulating layer and the first molding layer; and a second protective layer disposed between the lower surface of the insulating layer and the second molding layer.

In addition, a lower surface of the first post bump is positioned higher than a lower surface of the second molding layer, and an upper surface of the second post bump is positioned lower than an upper surface of the first molding layer.

In addition, an upper surface of the first post bump is in direct contact with a lower surface of the second pad, and a lower surface of the second post bump is in direct contact with an upper surface of the first pad.

In addition, an entire region of a side surface of the first post bump includes a first portion in direct contact with the second protective layer and a second portion in direct contact with the second molding layer, and an entire region of a side surface includes a third portion in direct contact with the first protective layer and a fourth portion in direct contact with the first molding layer.

In addition, an entire region of a side surface of the first post bump is in direct contact with the second molding layer, and an entire region of a side surface of the second post bump is in direct contact with the first molding layer.

In addition, the printed circuit board further includes a first seed layer disposed between a lower surface of the insulating layer and the second pad; and a second seed layer disposed between an upper surface of the insulating layer and the first pad, wherein the first post bump is an electroplating layer formed using the first seed layer, and the second post bump is an electroplating layer formed using the second seed layer.

In addition, the first seed layer includes a first region disposed between the lower surface of the insulating layer and the second pad, and a second region extending from the first region and disposed between the lower surface of the insulating layer and the second protective layer and, wherein the second seed layer includes a third region disposed between the upper surface of the insulating layer and the first pad, and a fourth region extending from the third region and disposed between the upper surface of the insulating layer and the first protective layer.

In addition, the first seed layer includes a first region disposed between the lower surface of the insulating layer and the second pad, and a second region spaced apart from the first region and disposed between the lower surface of the insulating layer and the second protective layer and, wherein the second seed layer includes a third region disposed between the upper surface of the insulating layer and the first pad, and a fourth region spaced apart from the third region and disposed between the upper surface of the insulating layer and the first protective layer.

In addition, the first seed layer includes a fifth region connecting the first region and the second region and disposed between the lower surface of the insulating layer and the second molding layer, and the second seed layer includes a sixth region connecting the third region and the fourth region and disposed between the upper surface of the insulating layer and the first molding layer.

In addition, a vertical width or height of each of the first and second post bumps has a range of 0.4 to 0.7 times a horizontal width of each of the first and second post bumps.

Meanwhile, the package substrate according to the embodiment includes a printed circuit board including an insulating layer, a plurality of first pads disposed on an upper surface of the insulating layer, a plurality of second pads disposed on a lower surface of the insulating layer, a first device mounted on any one of the plurality of first pads, a second device mounted on any one of the plurality of second pads, a first molding layer disposed on an upper surface of the insulating layer and molding the first device, a second molding layer disposed on the lower surface of the insulating layer and molding the second device, a first post bump disposed on any one of the plurality of second pads, and a second post bump disposed on any one of the plurality of first pads; a first solder ball disposed on a lower surface of the first post bump; a second solder ball disposed on an upper surface of the second post bump; a main board attached to the first post bump of the printed circuit board through the first solder ball; and an upper package attached to the second post bump of the printed circuit board through the second solder ball, wherein a lower surface of the second molding layer of the printed circuit board is positioned on the same plane as a lower surface of the second device, and a lower surface of the second device is disposed to directly face the upper surface of the main board.

In addition, an upper surface of the first post bump is in direct contact with the lower surface of the second pad, a lower surface of the second post bump is in direct contact with the upper surface of the first pad, and an entire region of a side surface of the first post bump is in direct contact with at least one of the second protective layer and the second molding layer, and an entire region of a side surface of the second post bump is in direct contact with at least one of the first protective layer and the first molding layer.

In addition, the printed circuit board further includes a first seed layer disposed between a lower surface of the insulating layer and the second pad; and a second seed layer disposed between the upper surface of the insulating layer and the first pad, wherein the first post bump is an electroplating layer formed using the first seed layer, and the second post bump is an electroplating layer formed using the second seed layer.

A printed circuit board according to an embodiment includes an insulating layer; a first pad disposed on an upper surface of the insulating layer; a second pad disposed on a lower surface of the insulating layer; a first device mounted on the first pad; a second device mounted on the second pad; a first molding layer disposed on the insulating layer and molding the first device; and a second molding layer disposed on a lower surface of the insulating layer and molding the second device, wherein a lower surface of the second molding layer is disposed on the same plane as a lower surface of the second device.

In addition, an upper surface of the first molding layer is positioned higher than an upper surface of the first device.

In addition, the printed circuit board further includes a first protective layer disposed between the upper surface of the insulating layer and the first molding layer; and a second protective layer disposed between the lower surface of the insulating layer and the second molding layer.

In addition, the printed circuit board further includes a post bump disposed under the lower surface of the second pad exposed through an opening of the second protective layer.

In addition, a lower surface of the post bump is positioned higher than a lower surface of the second molding layer.

In addition, an upper surface of the post bump is in direct contact with the lower surface of the second pad.

In addition, an entire region of a side surface of the post bump includes a first portion in direct contact with the second protective layer and a second portion in direct contact with the second molding layer.

In addition, an entire region of a side surface of the post bump is in direct contact with the second molding layer.

In addition, the printed circuit board further includes a seed layer disposed between the lower surface of the insulating layer and the second pad, wherein the post bump is an electroplating layer formed using the seed layer.

In addition, the seed layer includes a first region disposed between the lower surface of the insulating layer and the second pad, and a second region extending from the first region and disposed between the lower surface of the insulating layer and the second protective layer.

In addition, the seed layer includes a first region disposed between the lower surface of the insulating layer and the second pad, and a second region spaced apart from the first region and disposed between the lower surface of the insulating layer and the second protective layer.

In addition, the seed layer includes a third region connecting between the first region and the second region and disposed between the insulating layer and the second molding layer.

In addition, a vertical width or height of the post bump has a range of 0.4 to 0.7 times a horizontal width of the post bump.

Meanwhile, a package substrate according to an embodiment includes a printed circuit board including an insulating layer; a first pad disposed on an upper surface of the insulating layer; a second pad disposed on a lower surface of the insulating layer; a first device mounted on the first pad; a second device mounted on the second pad; a first molding layer disposed on the insulating layer and molding the first device; a second molding layer disposed on a lower surface of the insulating layer and molding the second device; a first protective layer disposed between an upper surface of the insulating layer and the first molding layer; a second protective layer disposed between the lower surface of the insulating layer and the second molding layer; and a post bump disposed under the lower surface of the second pad exposed through an opening of the second protective layer; a solder ball disposed on a lower surface of the post bump; and a main board attached to the post bump of the printed circuit board through the solder ball, wherein a lower surface of the second molding layer of the printed circuit board is positioned on the same plane as a lower surface of the second device, and a lower surface of the second device is disposed to directly face the upper surface of the main board.

In addition, an upper surface of the post bump is in direct contact with a lower surface of the second pad, and an entire region of a side surface of the post bump is in direct contact with at least one of the second protective layer and the second molding layer.

In addition, the printed circuit board includes a seed layer disposed between the lower surface of the insulating layer and the second pad, and the post bump is an electroplating layer formed using the seed layer.

A printed circuit board according to an embodiment includes an insulating layer; a pad disposed on an upper surface of the insulating layer; a seed layer disposed between the upper surface of the insulating layer and the pad; a protective layer disposed on the upper surface of the insulating layer and having an opening exposing an upper surface of the pad; and a post bump disposed on the upper surface of the pad exposed through the opening of the protective layer, wherein a lower surface of the post bump is in direct contact with the upper surface of the pad.

In addition, at least a part of a side surface of the post bump is in direct contact with the protective layer.

In addition, the post bump is an electroplating layer formed using the seed layer.

In addition, the seed layer includes: a first region disposed between the upper surface of the insulating layer and the pad; and a second region extending from the first region and disposed between a lower surface of the insulating layer and the second protective layer.

In addition, the seed layer includes a first region disposed between an upper surface of the insulating layer and the pad; and a second region spaced apart from the first region and disposed between the upper surface of the insulating layer and the protective layer.

In addition, the seed layer includes: a third region disposed on the insulating layer exposed through the opening of the protective layer and connecting between the first region and the second region.

In addition, a vertical width or a height of the post bump is in a range of 0.4 to 0.7 times a horizontal width of the post bump.

In addition, the printed circuit board further includes a device mounted on the upper surface of the insulating layer; and a molding layer disposed on an upper surface of the protective layer and molding the device.

In addition, an upper surface of the molding layer is positioned on the same plane as the upper surface of the device.

In addition, the upper surface of the post bump is positioned lower than the upper surface of the molding layer.

In addition, an entire region of the side surface of the post bump includes: a first portion in direct contact with the protective layer; and a second portion in direct contact with the molding layer.

In addition, an entire region of the side surface of the post bump is in direct contact with the molding layer.

On the other hand, a manufacturing method of the printed circuit board according to the embodiment includes preparing an insulating layer; forming a seed layer on an upper surface of the insulating layer; forming a pad on an upper surface of the seed layer by performing electroplating using the seed layer of the insulating layer; forming a protective layer having an opening exposing an upper surface of the pad on an upper surface of the insulating layer; forming a post bump on the upper surface of the pad exposed through the opening of the protective layer by performing electroplating using the seed layer of the insulating layer; and removing at least a portion of the seed layer; wherein the seed layer for electroplating the pad is the same as the seed layer for electroplating the post bump, and the lower surface of the post bump is in direct contact with the upper surface of the pad.

In addition, at least a part of a side surface of the post bump is in direct contact with the protective layer.

In addition, the seed layer after the removing includes a first region disposed between the upper surface of the insulating layer and the pad, and a second region extending from the first region and disposed between the lower surface of the insulating layer and the second protective layer.

In addition, the seed layer after the removing include a first region disposed between the upper surface of the insulating layer and the pad, and a second region spaced apart from the first region and disposed between the upper surface of the insulating layer and the protective layer.

In addition, the seed layer after the removing includes a third region disposed on the insulating layer exposed through the opening of the protective layer and connecting the first region and the second region.

In addition, a vertical width or height of the post bump has a range of 0.4 to 0.7 times a horizontal width of the post bump.

Advantageous Effects

According to this embodiment, a package substrate is manufactured by forming post bumps on a printed circuit board and attaching an upper package or a main board using the post bumps, accordingly, it is possible to respond to a fine pitch, and it can maximize the productivity of the manufacturer.

In addition, according to this embodiment, each device is mounted on both surfaces of the printed circuit board, and a molding layer for molding the mounted device is disposed. Accordingly, it is possible to maintain the balance of the upper and lower portions of the printed circuit board compared to the existing single-sided molding structure. Accordingly, it is possible to minimize the occurrence of warpage of the printed circuit board.

In addition, according to the embodiment, each device is mounted on both sides of the printed circuit board. Accordingly, all active or passive devices mounted on the existing upper package can be mounted on the printed circuit board, and accordingly, the overall thickness of the package substrate may be reduced.

In addition, according to the present embodiment, the lower surface of the molding layer to which the main board is attached is positioned on the same plane as the lower surface of the device mounted on a lower portion of the printed circuit board. Accordingly, the reliability of the connection between the main board and the printed circuit board can be improved.

In addition, according to the present embodiment, the post bumps are respectively disposed on both sides of the printed circuit board, and thereby, it is possible to improve the package balance compared to the existing single-sided post-bump arrangement structure, and accordingly, it is possible to minimize the occurrence of warpage.

In addition, according to the present embodiment, post bumps are respectively disposed on both surfaces of the printed circuit board, thereby, it is possible to dissipate heat to both sides of the printed circuit board through the post bump, and accordingly, heat dissipation characteristics may be improved.

In addition, according to the present embodiment, the height of the post bump can be adjusted as much as the height of the device, and thus the design of the package is easy.

In addition, according to an embodiment, the post bump can be formed on the pad by using the seed layer disposed under the pad without separately forming a seed layer for electroplating under the post bump. Accordingly, there is no need to form a separate seed layer for forming the post bump, and thereby, the manufacturing process can be simplified, and it is possible to solve the crack generation between the seed layer of the post bump, and accordingly, the reliability and durability of the product can be improved. In addition, according to the embodiment, it is not necessary to separately perform a desmear process on a solder resist, and thereby, the whitening phenomenon of the solder resist by a desmear solution can be prevented.

In addition, in the embodiment, an aspect ratio of the post bump is included in the range of 0.4 to 0.7, and thereby, the durability of the post bump can be improved.

DESCRIPTION OF DRAWINGS

FIG. 1 is a cross-sectional view showing a package substrate according to a prior art.

FIG. 2 is a view showing a printed circuit board according to a first embodiment.

FIG. 3 is a view showing a structure of a second material included in an insulating layer of a circuit board according to an embodiment.

FIG. 4 is a view showing an arrangement structure of a first material and a second material included in an insulating layer of a printed circuit board according to an embodiment.

FIG. 5 is a view for explaining a structure of a post bump in a comparative example.

FIG. 6 is a view for explaining a structure of a post bump according to a first embodiment.

FIG. 7 is a view for explaining a structure of a post bump according to a second embodiment.

FIG. 8 is a view for explaining a structure of a post bump according to a third embodiment.

FIGS. 9 to 15 are views showing a manufacturing method of the printed circuit board according to a first embodiment shown in FIG. 2 in order of process.

FIG. 16 is a view showing a package substrate according to a first embodiment.

FIG. 17 is a view showing a printed circuit board according to a second embodiment.

FIG. 18 is a view showing a package substrate according to a second embodiment.

DETAILED DESCRIPTION OF THE EMBODIMENTS

Hereinafter, embodiments of the present invention will be described in detail with reference to the accompanying drawings. However, the spirit and scope of the present invention is not limited to a part of the embodiments described, and may be implemented in various other forms, and within the spirit and scope of the present invention, one or more of the elements of the embodiments may be selectively combined and substituted for use.

In addition, unless expressly otherwise defined and described, the terms used in the embodiments of the present invention (including technical and scientific terms may be construed the same meaning as commonly understood by one of ordinary skill in the art to which this invention belongs, and the terms such as those defined in commonly used dictionaries may be interpreted as having a meaning that is consistent with their meaning in the context of the relevant art.

Further, the terms used in the embodiments of the present invention are for describing the embodiments and are not intended to limit the present invention. In this specification, the singular forms may also include the plural forms unless specifically stated in the phrase, and may include at least one of all combinations that may be combined in A, B, and C when described in "at least one (or more) of A (and), B, and C".

Further, in describing the elements of the embodiments of the present invention, the terms such as first, second, A, B, (a), and (b) may be used. These terms are only used to distinguish the elements from other elements, and the terms are not limited to the essence, order, or order of the elements.

In addition, when an element is described as being "connected", "coupled", or "connected" to another element, it may include not only when the element is directly "connected" to, "coupled" to, or "connected" to other elements, but also when the element is "connected", "coupled", or "connected" by another element between the element and other elements.

In addition, when described as being formed or disposed "on (over)" or "under (below)" of each element, the "on (over)" or "under (below)" may include not only when two elements are directly connected to each other, but also when one or more other elements are formed or disposed between two elements.

Further, when expressed as "on (over)" or "under (below) ", it may include not only the upper direction but also the lower direction based on one element.

FIG. 2 is a view showing a printed circuit board according to a first embodiment.

Referring to FIG. 2, a printed circuit board 100 includes a first insulating layer 101, a circuit pattern 102, a via 103, a second insulating layer 103, a third insulating layer 104, and a first Pad 106, a second pad 107, a protective layer 108, a first molding layer 109, a second molding layer 110, a first connection portion 111, a first device 112, a second connection portion 113, a second device 114, a third connection portion 115, a third device 116, and a post bump 117.

The first insulating layer 101 may be a core substrate.

The first insulating layer 101 may be a support substrate of a printed circuit board on which a single circuit pattern is formed, but may also mean a region on which any one circuit pattern is formed among substrates having a plurality of stacked structures.

A second insulating layer 104 is formed on the first insulating layer 101, and a third insulating layer 105 is formed below the first insulating layer 101.

The first to third insulating layers 101, 104, and 105 form an insulating plate, and may be a thermosetting or thermoplastic polymer substrate, a ceramic substrate, an organic-inorganic composite material substrate, or a glass fiber impregnated substrate, and it may include an epoxy-based insulating resin such as FR-4, BT (Bismaleimide Triazine), and ABF (Ajinomoto Build up Film) in the case of including a polymer resin, and alternatively, it may include a polyimide-based resin, but is not particularly limited thereto.

The first to third insulating layers 101, 104, and 105 may be formed of different materials. For example, the first insulating layer 101 is an impregnated substrate including glass fibers, and the second and third insulating layers 104 and 105 may be insulating sheets made of only resin.

The first insulating layer 101 is a central insulating layer, and may be thicker than the second and third insulating layers 104 and 105.

An inner circuit pattern 102 is formed on at least one of upper and lower portions of the first insulating layer 101.

The circuit pattern 102 may be formed by a conventional manufacturing process of a printed circuit board, such as additive process (Additive process), subtractive process (Subtractive Process), MSAP (Modified Semi Additive Process), SAP (Semi Additive Process) method, etc., and a detailed description thereof will be omitted here.

In addition, a via 103 is formed in the first insulating layer 101 to connect the internal circuit patterns 102 formed in different layers.

External circuit patterns (not shown) are also formed on the second insulating layer 104 formed on the first insulating layer 101 and the third insulating layer 105 formed under the first insulating layer.

External circuit patterns (not shown) are also formed on exposed surfaces of the second insulating layer 104 formed on the first insulating layer 101 and the third insulating layer 105 formed under the first insulating layer.

The external circuit pattern may mean the pads 106 and 107 shown in the drawing. That is, the external circuit pattern is formed by the same process as the pads 106 and 107, and is divided into a pattern and a pad according to their function.

That is, a circuit pattern is formed on the surfaces of the second insulating layer 104 and the third insulating layer 105, according to the function of the circuit pattern, a part may be an external circuit pattern, and the other part may be the pads 106 and 107 connected to a chip or other substrate.

In addition, vias are also formed in the second insulating layer 104 and the third insulating layer 105.

The via 103 as described above forms a via hole for opening at least one of the first, second, and third insulating layers 101, 104, and 105 through a laser process, and accordingly, it may be formed by filling the inside of the formed via hole with a metal paste.

In this case, the metal material forming the via 103 may be any one material selected from Cu, Ag, Sn, Au, Ni and Pd, and the metal material may be filled using any one or a combination of electroless plating, electrolytic plating, screen printing, sputtering, evaporation, inkjetting and dispensing.

Meanwhile, the via hole may be formed by any one of machining methods, including mechanical, laser, and chemical machining.

When the via hole is formed by mechanical processing, methods such as milling, drilling, and routing may be used, and when the via hole is formed by laser processing, a UV or CO2 laser method may be used, and when the via hole is formed by chemical processing, drugs containing aminosilane, ketones, etc. may be used, and the like, thereby the first, second, and third insulating layers 101, 104, and 105 may be opened.

On the other hand, the processing by the laser is a cutting method that takes the desired shape to melt and evaporate a part of the material by concentrating optical energy on the surface, it can easily process complex formations by computer programs, and can process composite materials that are difficult to cut by other methods.

In addition, the processing by the laser can have a cutting diameter of at least 0.005 mm, and has a wide advantage in a range of possible thicknesses.

As the laser processing drill, it is preferable to use a YAG (Yttrium Aluminum Garnet) laser, a CO2 laser, or an ultraviolet (UV) laser. The YAG laser is a laser that can process both the copper foil layer and the insulating layer, and the CO2 laser is a laser that can process only the insulating layer.

A protective layer 108 is formed on the surfaces (a surface exposed to the outside, a surface on which the pad is formed) of the second insulating layer 104 and the third insulating layer 105.

The protective layer 108 has an opening exposing an upper surface of the first pad 106.

That is, the protective layer 108 is to protect the surfaces of the second insulating layer 104 and the third insulating layer 105, and the front surface of the second insulating layer 104 and the third insulating layer 105. It has an opening for opening the surface of the stacked structure of the first pad 106 and the second pad 107 to be exposed.

The protective layer 108 may be formed of at least one layer using any one or more of Solder Resist (SR), oxide, and Au. Preferably, the protective layer 108 may be a solder resist. In addition, the protective layer 108 may include an upper protective layer or a first protective layer disposed on an upper surface of the second insulating layer 104. In addition, the protective layer 108 may include a lower protective layer or a second protective layer disposed under a lower surface of the third insulating layer 105.

The first pad 106 exposed by the opening of the protective layer 108 is classified according to its function.

That is, the first pad 106 may include a pad connected to a first device 112 and a pad connected to a second device 114.

To this end, connection portions 111 and 113 may be disposed on the first pad 106. That is, the first connection portion 111 may be disposed on a pad on which the first device 112 is mounted among the first pads 106. In addition, a second connection portion 113 may be disposed on a pad on which the second device 114 is mounted among the first pads 106.

The first connection portion 111 and the second connection portion 113 may have a hexahedral shape. For example, cross-sections of the first connection portion 111 and the second connection portion 113 may include a rectangular shape. In more detail, the cross-sections of the first connection portion 111 and the second connection portion 113 may include a rectangular or square shape. The first connection portion 111 and the second connection portion 113 may include gold (Au). For example, the first connection portion 111 and the second connection portion 113 may be gold bumps.

A first device 112 may be attached on the first connection portion 111. In addition, a second device 114 may be attached on the second connection portion 113.

The first device 112 and the second device 114 may be active devices and passive devices constituting a memory package. However, the embodiment is not limited thereto, and the first device 112 and the second device 114 may include devices other than the memory package. For example, the first device 112 and the second device 114 may include at least one of a drive IC chip, a diode chip, a power IC chip, a touch sensor IC chip, a multi-layer ceramic condenser (MLCC) chip, a BGA (Ball Grid Array) chip and a chip capacitor.

A first molding layer 109 is disposed on the upper protective layer or the first protective layer among the protective layer 108. The first molding layer 109 may be disposed on the upper protective layer or the first protective layer to cover the first device 112 and the second device 114. The first molding layer 109 may be formed of resin. The first molding layer 109 can protect the first device 112 and the second device 114 from an external environment by molding the first device 112 and the second device 114 therein. An upper surface of the first molding layer 109 may be positioned higher than upper surfaces of the first device 112 and the second device 114. For example, the upper surface of the first device 112 and the upper surface of the second device 114 may be disposed to cover the upper surface of the first molding layer 109.

Meanwhile, the second pad 107 is disposed on a lower surface of the third insulating layer 105. In addition, the second pad 107 may include a mounting pad on which the third device 116 is mounted, and a bump pad on which a post bump 117 for connection to an external main board is disposed.

A third connection portion 115 may be disposed on the mounting pad of the second pad 107. In this case, the third connection portion 115 may have a shape different from that of the first connection portion 111 and the second connection portion 113. For example, the third connection portion 115 may have a spherical shape. Alternatively, the cross-section of the third connection portion 115 may include a circular shape. Alternatively, the third connection portion 115 may have a round shape wholly or partially. For example, the cross-sectional shape of the third connection portion 115 may include a flat surface on one side and a curved surface on the other side opposite to the one side.

The third connection portion 115 may have a size different from that of the first connection portion 111 and the second connection portion 113. For example, the third connection portion 115 may be formed to have a smaller size than the first connection portion 111 and the second connection portion 113. The third connection portion 115 may be included at least one of copper (Cu), tin (Sn), aluminum (Al), zinc (Zn), indium (In), lead (Pb), antimony (Sb), bismuth (bi), silver (Ag) and nickel (Ni). The third connection portion 115 may be a solder bump. The third connection portion 115 may be a solder ball, and thus may be melted at the temperature of a reflow process.

The post bump 117 may be disposed under the lower protective layer or the second pad 107 exposed through the second protective layer or the lower surface of the bump pad.

The post bump 117 may protrude from the lower surface of the lower protective layer or the second protective layer. The post bump 117 may have an upper width and a lower width equal to each other. Also, the post bump 117 may have an upper width and a different lower width. The post bump 117 may have a pillar shape.

The post bump 117 may be composed of at least two or more. For example, the post bump 117 may include a first post bump 117 disposed on any one of the second pad formed on a left side with respect to the center among the plurality of second pads 107, and a second post bump disposed on any one of the second pad formed on a right side.

In this case, the lower surface of the post bump 117 may be positioned higher than the lower surface of the third device 116. The post bump 117 may include a first part disposed in the opening of the lower protective layer or the second protective layer, and a second part protruding under a lower surface of the lower protective layer or the second protective layer.

In this case, an upper width and a lower width of the first part may be equal to each other. Also, an upper width and a lower width of the second part may be equal to each other. In addition, the width of the first part and the width of the second part may be equal to each other. Alternatively, the width of the first part and the width of the second part may be different from each other. For example, the width of the second part may be greater than the width of the first part. Accordingly, the second part of the post bump 117 may be formed to expand to the lower surface of the lower protective layer or the second protective layer.

A surface treatment layer (not shown) may be disposed on a lower surface of the post bump 117. For example, the surface treatment layer for protecting the surface of the post bump 117 may be disposed on a lower surface of the post bump 117. The surface treatment layer may be formed by any one surface treatment method of Organic Solderability Preservative (OSP), ENEPIG, and Thin-Nickel Electroless Palladium Immersion Gold (EPIG). In addition, the surface treatment layer may be formed of soft gold composed of Ni/Au, and may have a thickness of 5 to 10 μm.

A second molding layer 110 is disposed under the lower protective layer or the second protective layer among the protective layers 108. The second molding layer 110 may be disposed on the lower protective layer or the second protective layer to cover the third device 116. The second molding layer 110 may be formed of resin. In this case, the second molding layer 110 may be disposed to cover a side portion of the third device 116. Also, the second molding layer 110 may be disposed to expose a lower surface of the third device 116. In other words, the lower surface of the second molding layer 110 may be positioned on the same plane as the lower surface of the third device 116. In this case, the lower surface of the second molding layer 110 is the same as the lower surface of the third device 116. In the case, in a state in which the second molding layer 110 is formed to cover the lower surface of the third device 116, it may be formed by grinding the second molding layer 110 so that the lower surface of the second molding layer 110 is positioned on the same plane as the lower surface of the third device 116.

As described above, the printed circuit board 100 according to the first embodiment includes a first molding layer 109 for molding devices mounted on the insulating layers 101, 104, and 105. In addition, the printed circuit board 100 according to the first embodiment includes a second molding layer 110 for molding devices mounted under the insulating layers 101, 104, and 105. As such, in the printed circuit board 100, the molding layer is not disposed on only one side of the insulating layer, but the molding layer is disposed on both sides, thereby, it is possible to maintain the balance of both sides of the printed circuit board, and accordingly, it is possible to minimize the occurrence of warpage.

Meanwhile, the insulating layers 101, 104, and 105 in the embodiment may have a low dielectric constant.

That is, the first insulating layer 101 includes glass fibers. Generally, the glass fiber has a thickness of about 12 μm. Accordingly, the thickness of the first insulating layer 101 may have a thickness of 21 μm±2 μm including the thickness of the glass fiber. Specifically, the thickness of the first insulating layer 101 may be in a range of 19 μm to 23 μm.

Alternatively, glass fibers are not included in the second insulating layer 104 and the third insulating layer 105. Preferably, the second insulating layer 104 and the third insulating layer 105 may be made of RCC. Accordingly, each of the second insulating layer 104 and the third insulating layer 105 may have a thickness of 12 μm±2 μm. That is, the thickness of each of the second insulating layer 104 and the third insulating layer 105 may be in a range of 10 μm to 14 μm.

In the embodiment, the insulating layer is formed using the RCC having a low dielectric constant, thereby reducing the thickness of the circuit board and providing a highly reliable circuit board in which signal loss is minimized even in a high frequency band. This may be achieved by the properties of materials included in the second insulating layer 104 and the third insulating layer 105, which will be described in more detail below.

To this end, the second insulating layer 104 and the third insulating layer 105 may include a material capable of securing mechanical/chemical reliability with a low dielectric constant.

In detail, the second insulating layer 104 and the third insulating layer 105 may have a dielectric constant Dk of 3.0 or less. In more detail, the second insulating layer 104 and the third insulating layer 105 may have a dielectric constant of 2.03 to 2.7. Therefore, the second insulating layer 104 and the third insulating layer 105 may have a low dielectric constant, and when an insulating layer is applied to a circuit board for high frequency use, transmission loss according to the dielectric constant of the insulating layer can be reduced.

In addition, the second insulating layer 104 and the third insulating layer 105 may have a coefficient of thermal expansion of 50 ppm/° C. or less. In detail, the second insulating layer 104 and the third insulating layer 105 may have a coefficient of thermal expansion of 15 ppm/° C. to 50 ppm/° C.

Accordingly, the second insulating layer 104 and the third insulating layer 105 may have a low coefficient of thermal expansion, thereby minimizing cracks in the insulating layer due to temperature change.

To this end, the second insulating layer 104 and the third insulating layer 105 may be formed of two materials. In detail, the second insulating layer 104 and the third insulating layer 105 may include a material in which two compounds are mixed. In detail, the second insulating layer 104 and the third insulating layer 105 may include a first compound and a second compound.

The first material and the second material may be included in a certain ratio range. In detail, the first material and the second material may be included in a ratio of 4:6 to 6:4.

In addition, the second insulating layer 104 and the third insulating layer 105 may further include inorganic particles. In detail, the second insulating layer 104 and the third insulating layer 105 may further include inorganic particles such as silicon dioxide (SiO2). The inorganic particles may be included in an amount of about 55 wt % to about 70 wt % based on the total of the second insulating layer 104 and the third insulating layer 105.

When the ratio of the inorganic particles is out of the above range, the size of the coefficient of thermal expansion or the dielectric constant may be increased by the inorganic particles, and thus properties of the insulating layer may be deteriorated.

In addition, the first material and the second material may be chemically non-bonded with each other in the second insulating layer 104 and the third insulating layer 105. However, embodiments are not limited thereto, and the first material including the first compound and the second material including the second compound may be chemically bonded directly or through a separate linking group.

The first material may include a material having an insulating property. In addition, the first material may have improved mechanical properties due to high impact strength. In detail, the first material may include a resin material. For example, the first material may include a first compound including polyphenyl ether (PPE).

The first material may include a plurality of the first compounds, and the first compounds may be formed by chemically bonding with each other. In detail, the first compound may be linearly connected to each other by a covalent bond, that is, a pi-pi bond (ππ).

That is, the first compounds may be formed by chemically bonding with each other so that the first material has a molecular weight of about 300 to 500.

In addition, the second material may include a second compound. In detail, the second material may be formed by chemically bonding a plurality of second compounds to each other.

The second compound may include a material having a low dielectric constant and a coefficient of thermal expansion. In addition, the second compound may include a material having improved mechanical strength.

The second compound may include tricyclodecane and a terminal group connected to the tricyclodecane. The terminal group connected to the tricyclodecane may include various materials in which the second compounds may be connected to each other by a carbon double bond (C═C bonding). In detail, the terminal group connected to the tricyclodecane may include an acrylate group, an epoxide group, a carboxyl group, a hydroxyl group, and an isocyanate group.

The second compounds may be linked to each other between the terminal groups connected to the tricyclodecane. Specifically, the second compounds are cross-linked between the terminal groups by a carbon double bond (C═C bonding). to form a network structure.

FIG. 3 is a view showing a structure of a second material included in an insulating layer of a circuit board according to an embodiment.

Specifically, referring to FIG. 3, the second compounds may be cross-linked to form a network structure. That is, the second compounds may be an aggregate of bonds having a plurality of network structures.

Accordingly, the second material formed of the second compounds may have a low dielectric constant and a coefficient of thermal expansion according to material properties, and may have improved mechanical strength due to the network structure.

FIG. 4 is a view for explaining the arrangement of the first material and the second material constituting the second insulating layer 104 and the third insulating layer 105.

The first material and the second material may be formed as one single phase in the insulating layer. Referring to FIG. 8, the first material connected by the covalent bond of the first compound may be disposed inside the second material formed by the second compound cross-linked to each other to form a network structure.

In detail, the first compound may be disposed inside the network structure of the second material formed by chemically bonding the second compound to prevent the first material from being separated from the second material.

That is, the second insulating layer 104 and the third insulating layer 105 may be formed in one single-phase structure without the first material and the second material being phase-separated in the insulating layer. Accordingly, since the first material and the second material have a low dielectric constant and a low coefficient of thermal expansion due to material properties of the first material and the second material, they may be formed as a single phase, and thus have high mechanical strength.

Meanwhile, in the embodiment, the post bump 117 may be formed using a plating seed layer (described later) used to form the second pad 107. Accordingly, in the printed circuit board 100 in the embodiment, a separate seed layer for forming the post bump 117 may be omitted. Also, the post bump 117 may be disposed in direct contact with the second pad 107. Also, the post bump 117 may be disposed in direct contact with the lower protective layer or the second protective layer. That is, the upper surface of the post bump 117 may directly contact the lower surface of the second pad 107. In addition, a side surface of the post bump 117 may directly contact the lower protective layer or the second protective layer. That is, in the printed circuit board of the comparative example, a separate seed layer for electroplating the post bumps was formed between the pads and the post bumps. Accordingly, the printed circuit board of the comparative example had a structure in which the post bump and the pad did not directly contact each other.

That is, in the embodiment, the post bump can be formed on the pad by using the seed layer disposed under the pad without separately forming a seed layer for electroplating under the post bump. According to this, there is no need to form a separate seed layer for forming the post bump, accordingly, the manufacturing process can be simplified. And, it is possible to solve the crack generation between the seed layer of the post bump, and accordingly, the reliability and durability of the product can be improved. In addition, according to the embodiment, it is not necessary to separately perform the desmear process on the solder resist, and thereby, the whitening phenomenon of the said soldering resist by a desmear solution can be prevented.

Hereinafter, the structure of the post bump 117 will be described in more detail.

FIG. 5 is a view for explaining a structure of a post bump in a comparative example, FIG. 6 is a view for explaining a structure of a post bump according to a first embodiment, FIG. 7 is a view for explaining a structure of a post bump according to a second embodiment, and FIG. 8 is a view for explaining a structure of a post bump according to a third embodiment.

Referring to FIG. 5, the printed circuit board of the comparative example includes an insulating layer 41.

And, a pad 42 is disposed on the insulating layer 41. In this case, a first seed layer 43 for electroplating the pad 42 is disposed between the insulating layer 41 and the pad 42.

In addition, a protective layer 44 having an opening exposing at least a part of an upper surface of the pad 42 is disposed on the insulating layer 41. In addition, a post bump 46 may be disposed on the upper surface of the pad 42 exposed through the opening of the protective layer 44. That is, the post bump 46 has a predetermined height and is disposed on the pad 42 with a protruding structure, and accordingly, the post bump 46 cannot be formed by electroless plating. Accordingly, the post bump 46 is formed by electroplating, and accordingly, a second seed layer 45 is disposed on the pad 107. The second seed layer 45 may be disposed on the upper surface of the pad 42, the upper surface of the protective layer 44, and an inner wall of the opening of the protective layer 44, respectively.

That is, in the printed circuit board of the comparative example, the second seed layer 45 is disposed on the pad 42 to form the post bump 46. Accordingly, in the printed circuit board of the comparative example, the process of forming the second seed layer 45 needs to be additionally performed, and thus the manufacturing process becomes complicated or the manufacturing time increases.

In addition, in the printed circuit board of the comparative example, a whitening phenomenon of the protective layer 44 occurs by the solution during the desmear process of the second seed layer 45 formed by electroless plating. In addition, in the printed circuit board of the comparative example, the second seed layer 45 is disposed between the pad and the post bump, and thus the bump layer has a porous microstructure. And, this porous structure has a low density of metal, thereby, a crack is generated in the porous second seed layer 45 due to an external impact or other physical force, and accordingly, there is a problem in that the post bump is destroyed and the reliability or durability of the product is rapidly reduced.

A horizontal width of the post bump of the comparative example was a, and a vertical width was b. In this case, an aspect ratio (b/a) of the post bumps of the comparative example was included in the range of 0.8 to 2.0, and thus the durability of the post bumps was low.

Referring to FIG. 6, the post bump of the first embodiment has a structure in which the second seed layer of the comparative example is omitted. In other words, the post bumps of the first embodiment may be formed by electroplating on the pad 107 using the seed layer 107A used for electroplating the pad. FIG. 6 includes a Solder Mask Defined (SMD) type protective layer.

In the SMD type, a part of the upper surface of the pad 107 is exposed through the opening of the protective layer 108A, and the post bump 117A may be disposed on the exposed upper surface. In addition, the opening of the protective layer 108A in the SMD type has a width smaller than the width of the upper surface of the post bump 117A. Accordingly, at least a part of the upper surface of the post bump 117A is covered by the protective layer 108A.

In this case, the lower surface of the post bump 117A in the first embodiment is disposed in direct contact with the upper surface of the pad 107. In addition, the side surface of the post bump 117A is disposed in direct contact with the protective layer 108A. Specifically, the side surface of the post bump 117A may be disposed in direct contact with the inner wall of the opening of the protective layer 108A.

Here, the seed layer 107A is disposed between the insulating layer 105 and the pad 107. In this case, the seed layer 107A is not removed immediately after the formation of the pad 107, but remains until the post bump 117A is formed. That is, after the pad is formed, all regions of the first seed layer in the comparative example except for the region disposed under the pad are removed.

Unlike this, the seed layer 107A according to the embodiment is not removed from the region other than the lower portion of the pad 107 until all the post bumps 117A are formed. Also, as the seed layer 107A is removed after the post bump 117A is formed as described above, it may have a structure different from that of the first seed layer of the comparative example.

That is, the first seed layer of the comparative example was disposed only in the region where the pad was disposed. That is, the first seed layer in the comparative example was only disposed under the pad.

Alternatively, in the first embodiment, the seed layer 107A may be disposed not only in the region on which the pad 107 is disposed, but also extend therefrom and be disposed under the protective layer 108A.

That is, the seed layer 107A includes a first region disposed between the pad 107 and the insulating layer 105, and a second region extending from the first region and disposed between the protective layer 108A and the insulating layer 105.

Accordingly, the post bump can be formed on the pad by using the seed layer disposed under the pad without separately forming a seed layer for electroplating under the post bump. According to this, there is no need to form a separate seed layer for forming the post bump, accordingly, the manufacturing process can be simplified. And, it is possible to solve the crack generation between the seed layer of the post bump, and accordingly, the reliability and durability of the product can be improved. In addition, according to the embodiment, it is not necessary to separately perform the desmear process on the solder resist, and thereby, the whitening phenomenon of the said soldering resist by a desmear solution can be prevented.

Also, the post bump according to the first embodiment may have a horizontal width of A and a vertical width of B. In addition, an aspect ratio (B/A) of the post bump 117A in the first embodiment is included in the range of 0.4 to 0.7, thereby improving the durability of the post bump 117A. In other words, the vertical width or height of the post bump is set to have a range of 0.4 to 0.7 times the horizontal width of the post bump. At this time, when the aspect ratio (B/A) of the post bump 117A is less than 0.4, the height of the post bump 117A is not secured, so that the post bump 117A cannot function normally. In addition, when the aspect ratio (B/A) of the post bump 117A is greater than 0.7, as the vertical width of the post bump 117A is too large compared to the horizontal width, there is a problem in durability in which the post bump 117A easily collapses.

In addition, the side surface of the post bump 117A having such a structure may include a first portion in direct contact with the protective layer 108 and a second portion in direct contact with the second molding layer 110. That is, the post bump in the comparative example has a structure that does not include the first portion of the post bump as a seed layer is additionally disposed between the protective layer and the post bump, but in the embodiment, the post bump may be disposed including the first portion in direct contact with the protective layer.

Referring to FIG. 7, the post bump of the second embodiment has a structure in which the second seed layer of the comparative example is omitted. In other words, the post bump of the second embodiment may be formed by electroplating on the pad 107 using the seed layer 107B used for electroplating the pad. FIG. 7 includes a Non-Solder Mask Defined (NSMD) type protective layer.

In the NSMD type, an entire region of an upper surface of the pad 107 is exposed through the opening of the protective layer 108B, and the post bump 117B may be disposed on the exposed upper surface. In addition, the opening of the protective layer 108B in the NSMD type has a width greater than the width of the upper surface of the post bump 117B. Accordingly, the protective layer 108B may be disposed at a position spaced apart from the post bump 117B and the pad 107 by a predetermined distance.

In this case, the lower surface of the post bump 117B in the second embodiment is disposed in direct contact with the upper surface of the pad 107. Also, a side surface of the post bump 117B may be exposed. More specifically, the side surface of the post bump 117B may be disposed in direct contact with the second molding layer 110.

Here, the seed layer 107B is disposed between the insulating layer 105 and the pad 107. In this case, the seed layer 107B is not removed immediately after the formation of the pad 107, but remains until the post bump 117B is formed. That is, in the first seed layer in the comparative example, after the pad is formed, all regions other than the region disposed under the pad are removed.

Unlike this, in the seed layer 107B according to the second embodiment, a part disposed in a region other than the lower portion of the pad 107 is not removed until all the post bumps 117B are formed. Also, as the seed layer 107B is removed after the post bump 117B is formed as described above, it may have a structure different from that of the first seed layer of the comparative example.

That is, the first seed layer of the comparative example was disposed only in the region where the pad was disposed. That is, the first seed layer in the comparative example was only disposed under the pad.

Alternatively, the seed layer 107B according to the second embodiment may be disposed not only in the region where the pad 107 is disposed, but also extend therefrom and be disposed under the protective layer 1086.

That is, the seed layer 107B includes a first region disposed between the pad 107 and the insulating layer 105, and a second region spaced apart from the first region and disposed between the protective layer 108B and the insulating layer 105.

Accordingly, the post bump can be formed on the pad by using the seed layer disposed under the pad without separately forming a seed layer for electroplating under the post bump. According to this, there is no need to form a separate seed layer for forming the post bump, accordingly, the manufacturing process can be simplified. And, it is possible to solve the crack generation between the seed layer of the post bump, and accordingly, the reliability and durability of the product can be improved. In addition, according to the embodiment, it is not necessary to separately perform the desmear process on the solder resist, and thereby, the whitening phenomenon of the said soldering resist by a desmear solution can be prevented.

Also, the post bump according to the second embodiment may have a horizontal width of A' and a vertical width of B'. In addition, the aspect ratio (B'/A') of the post bump 117B in the second embodiment is included in the range of 0.4 to 0.7, thereby improving durability of the post bump 117B. When the aspect ratio (B'/A') of the post bump 117B is less than 0.4, the height of the post bump 117B is not secured, so that the post bump 117B does not function normally. In addition, when the aspect ratio (B'/A') of the post bump 117B is greater than 0.7, as the vertical width compared to the horizontal width of the post bump 117B is too large, there is a problem in the durability of the post bump 117B being easily collapsed.

In addition, the entire region of the side surface of the post bump 117 in the second embodiment may have a structure in direct contact with the second molding layer 110.

Referring to FIG. 8, the post bump of the third embodiment has a structure in which the second seed layer of the comparative example is omitted. In other words, the post bump of the third embodiment may be formed by electroplating the pad 107 using the seed layer 107C used for electroplating the pad. FIG. 8 includes a Non-Solder Mask Defined (NSMD) type protective layer.

In the NSMD type, the entire region of the upper surface of the pad 107 is exposed through the opening of the protective layer 108C, and the post bump 117C may be disposed on the exposed upper surface. In addition, the opening of the protective layer 108C in the NSMD type has a width greater than the width of the upper surface of the post bump 117C. Accordingly, the protective layer 108C may be disposed at a position spaced apart from the post bump 117C and the pad 107 by a predetermined distance.

In this case, the lower surface of the post bump 117C in the third embodiment is disposed in direct contact with the upper surface of the pad 107. Also, a side surface of the post bump 117C may be exposed. More specifically, the side surface of the post bump 117C may be disposed in direct contact with the second molding layer 110.

Here, the seed layer 107C is disposed between the insulating layer 105 and the pad 107. In this case, the seed layer 107C is not removed immediately after the formation of the pad 107, but remains until the post bump 117C is formed. That is, in the first seed layer in the comparative example, after the pad is formed, all regions other than the region disposed under the pad are removed.

Unlike this, in the third embodiment, the seed layer 107C disposed in a region other than the lower portion of the pad 107 is not removed until all the post bumps 117C are formed. Also, as the seed layer 107C is removed after the post bump 117C is formed as described above, it may have a structure different from that of the first seed layer of the comparative example.

That is, the first seed layer of the comparative example was disposed only in the region where the pad was disposed. That is, the first seed layer in the comparative example was only disposed under the pad.

Alternatively, in the third exemplary embodiment, the seed layer 107C may be disposed not only in the region where the pad 107 is disposed, but also extend therefrom and be disposed under the protective layer 108C.

That is, the seed layer 107C includes a first region disposed between the pad 107 and the insulating layer 105, a second region spaced apart from the first region and disposed between the protective layer 108C and the insulating layer 105, and a third region disposed between the second molding layer 110 and the insulating layer 105 between the first and second regions.

Accordingly, the post bump can be formed on the pad by using the seed layer disposed under the pad without separately forming a seed layer for electroplating under the post bump. According to this, there is no need to form a separate seed layer for forming the post bump, accordingly, the manufacturing process can be simplified. And, it is possible to solve the crack generation between the seed layer of the post bump, and accordingly, the reliability and durability of the product can be improved. In addition, according to the embodiment, it is not necessary to separately perform the desmear process on the solder resist, and thereby, the whitening phenomenon of the said soldering resist by a desmear solution can be prevented.

Hereinafter, a method of manufacturing the printed circuit board according to the first embodiment shown in FIG. 2 will be described in detail.

FIGS. 9 to 15 are views showing a manufacturing method of the printed circuit board according to the first embodiment shown in FIG. 2 in order of process.

Firstly, referring to FIG. 9, the first insulating layer 101 which is the basis for manufacturing the printed circuit board 100 is prepared.

The first insulating layer 101 is a basic material for forming a circuit pattern present in the printed circuit board 100.

The first insulating layer 101 may be a thermosetting or thermoplastic polymer substrate, a ceramic substrate, an organic-inorganic composite material substrate, or a glass fiber impregnated substrate, and it may include a polymer resin such as an epoxy-based insulating resin, and alternatively, it may include a polyimide-based resin.

A metal layer (not shown) is formed on at least one surface of the first insulating layer 101. The metal layer (not shown) is used to form the internal circuit pattern 102.

The metal layer may be formed by electroless plating on the first insulating layer 101, and alternatively, a copper clad laminate (CCL) may be used.

In this case, when the metal layer is formed by electroless plating, roughness is provided to the upper surface of the first insulating layer 101 so that plating can be perform ed smoothly.

The metal layer may be formed of a conductive metal material such as copper (Cu), iron (Fe), and alloys thereof.

Thereafter, referring to FIG. 10, a circuit pattern 102 is formed by etching the metal layer on the upper and lower surfaces of the prepared first insulating layer 101, and a via hole (not shown) is formed in the first insulating layer 101, and accordingly, conductive via 103 for electrically connecting the circuit patterns 102 respectively formed on the upper and lower surfaces of the first insulating layer 101 to each other are formed.

The circuit pattern 102 may be formed by coating a photoresist on the upper and lower surfaces of the metal layer, patterning it, and then exposing and developing to form a photoresist pattern.

That is, the circuit pattern 102 may be formed by a conventional manufacturing process of a printed circuit board, such as an additive process, a subtractive process, a Modified Semi Additive Process (MSAP), and a Semi Additive Process (SAP) process. and the like, and a detailed description thereof will be omitted here.

The conductive via 103 is formed to conduct at least one or more regions of the single-layer circuit pattern and the two-layer circuit pattern. The via hole for forming the conductive via 103 may be formed through a process such as laser processing, and it may be formed through a process of filling the inside of the formed via hole with a metal material.

In this case, the metal material may be any one material selected from Cu, Ag, Sn, Au, Ni and Pd, and the metal material may be filled using any one or a combination of electroless plating, electrolytic plating, screen printing, sputtering, evaporation, inkjetting and dispensing.

In this case, the order in which the circuit pattern 102 and the conductive via 103 are formed is not very important. However, for more efficient processing of the via hole, the conductive via 103 is preferentially processed to form the conductive via 103, and then the circuit pattern 102 is formed.

Thereafter, referring to FIG. 11, a second insulating layer 104 covering the circuit pattern 102 formed on the upper surface of the first insulating layer 101 is formed.

In this case, the second insulating layer 104 may be formed as a single layer, but may have a structure in which each of the plurality of layers is formed and stacked in a plurality of layers. In this case, the second insulating layer 104 may be formed of a plurality of layers made of the same material by applying an epoxy, a phenol resin, a prepreg, a polyimide film, an ABF film, or the like. Preferably, the second insulating layer 104 may be formed of RCC as described above.

Accordingly, a metal layer (not shown) may be formed on one surface of the second insulating layer 104.

The metal layer may be present to later form the first pad 106 or an external circuit pattern (not shown).

The metal layer serves to facilitate the flow and spread of the resin during the press process by heat and pressure.

A third insulating layer 105 covering the circuit pattern 102 formed on the lower surface of the first insulating layer 101 is formed.

In this case, the third insulating layer 105 may be formed as a single layer, but may have a structure in which each is formed as a plurality of layers and stacked in a plurality of layers. In this case, the third insulating layer 105 may be formed of a plurality of layers made of the same material by applying an epoxy, a phenol resin, a prepreg, a polyimide film, an ABF film, or the like. Preferably, the third insulating layer 105 may be formed of RCC.

Accordingly, a metal layer (not shown) may be formed on one surface of the third insulating layer 105.

The metal layer may be present to form a second pad 107 or an external circuit pattern (not shown) later. The metal layer serves to facilitate the flow and spread of the resin during the press process by heat and pressure.

Next, the first pad 106 is formed by etching the metal layer on the upper surface of the prepared second insulating layer 104, and a via hole (not shown) is formed in the second insulating layer 104, and accordingly, a conductive via for electrically connecting the circuit pattern 102 formed on the upper surface of the first insulating layer 101 and the first pad 106 to each other is formed.

That is, the first pad 106 may be formed by a conventional manufacturing process of a printed circuit board, such as an additive process, a subtractive process, a Modified Semi Additive Process (MSAP), and a Semi Additive Process (SAP) process. and the like, and a detailed description thereof will be omitted here.

In addition, the second pad 107 is formed by etching the metal layer on the lower surface of the prepared third insulating layer 105, thereby forming a via hole (not shown) in the third insulating layer 105, and a conductive via for electrically connecting the circuit pattern 102 formed on the lower surface of the first insulating layer 101 and the second pad 107 to each other is formed.

Next, referring to FIG. 12, the first connection portion 111 and the second connection portion 113 are disposed on the first pad 106. Then, the first device 112 is mounted on the first pad 106 using the first connection portion 111.

In addition, a second device 114 is mounted on the first pad 106 using the second connection portion 113.

In addition, a third connection portion 115 is formed on the second pad 108. Then, a third device 116 is mounted on the second pad 108 using the third connection portion 115.

Next, referring to FIG. 13, a protective layer 108 is respectively formed on the upper surface of the second insulating layer 104 and the lower surface of the third insulating layer 105.

The protective layer 108 is for protecting the surface of the second insulating layer 104, the surface of the first pad 106, the surface of the third insulating layer 105, and the surface of the second pad 107, respectively, and, it may be formed of at least one or more layers using at least one of solder resist, oxide, and Au.

Thereafter, the protective layer 108 is processed to expose the surface of the second pad 107 to the outside.

That is, the protective layer 108 is formed to include an opening (not shown) exposing a portion of the upper surface of the second pad 107, and the opening may have a smaller diameter than that of the second pad 107 (SMD type).

Accordingly, edge regions of the first pad 106 and the second pad 107 are protected by the protective layer 108.

Thereafter, a post bump 117 is formed on the second pad 108 exposed through the opening of the protective layer 108. In this case, as described above, the post bump 117 may be formed by performing electroplating using the seed layer formed for electroplating the second pad 108.

Next, referring to FIG. 14, a first molding layer 109 is formed by molding the first device 112 and the second device 114 on the upper protective layer or the first protective layer of the protective layer 108.

In addition, a second molding layer for molding the third device 116 is formed on the lower protective layer or the second protective layer of the protective layer 108. In this case, the lower surface of the second molding layer 110 may be positioned lower than the lower surface of the third device 116. Also, an upper surface of the first molding layer 109 may be positioned higher than upper surfaces of the first device 112 and the second device 114.

Next, referring to FIG. 15, the lower region of the second molding layer 110 is ground to expose the lower surface of the third device 116. That is, the lower region of the second molding layer 110 may be ground so that the lower surface of the second molding layer 110 is positioned on the same plane as the lower surface of the third device 116.

According to this embodiment, a package substrate is manufactured by forming post bumps on a printed circuit board and attaching an upper package or a main board using the post bumps, accordingly, it is possible to respond to a fine pitch, and it can maximize the productivity of the manufacturer.

In addition, according to this embodiment, each device is mounted on both surfaces of the printed circuit board, and a molding layer for molding the mounted device is disposed. Accordingly, it is possible to maintain the balance of the upper and lower portions of the printed circuit board compared to the existing single-sided molding structure. Accordingly, it is possible to minimize the occurrence of warpage of the printed circuit board.

In addition, according to the embodiment, each device is mounted on both sides of the printed circuit board. Accordingly, all active or passive devices mounted on the existing upper package can be mounted on the printed circuit board, and accordingly, the overall thickness of the package substrate may be reduced.

In addition, according to the present embodiment, the lower surface of the molding layer to which the main board is attached is positioned on the same plane as the lower surface of the device mounted on a lower portion of the printed circuit board. Accordingly, the reliability of the connection between the main board and the printed circuit board can be improved.

In addition, according to the present embodiment, post bumps are respectively disposed on both surfaces of the printed circuit board, thereby, it is possible to dissipate heat to both sides of the printed circuit board through the post bump, and accordingly, heat dissipation characteristics may be improved.

In addition, according to the present embodiment, the height of the post bump can be adjusted as much as the height of the device, and thus the design of the package is easy.

In addition, according to an embodiment, the post bump can be formed on the pad by using the seed layer disposed under the pad without separately forming a seed layer for electroplating under the post bump. Accordingly, there is no need to form a separate seed layer for forming the post bump, and thereby, the manufacturing process can be simplified, and it is possible to solve the crack generation between the seed layer of the post bump, and accordingly, the reliability and durability of the product can be improved. In addition, according to the embodiment, it is not necessary to separately perform a desmear process on a solder resist, and thereby, the whitening phenomenon of the solder resist by a desmear solution can be prevented.

In addition, in the embodiment, an aspect ratio of the post bump is included in the range of 0.4 to 0.7, and thereby, the durability of the post bump can be improved.

FIG. 16 is a view showing a package substrate according to the first embodiment.

Referring to FIG. 16, the package substrate according to the first embodiment includes the printed circuit board 100 described with reference to FIG. 2.

In addition, a solder ball 210 may be disposed on a lower surface of the post bump 117 of the printed circuit board 100.

Also, a main board 200 may be attached under the post bump 117 by the solder ball 210. That is, a pad (not shown) in contact with the solder ball 210 may be disposed on the upper surface of the main board 200 while being aligned with the post bump 117. Accordingly, the upper surface of the main board 200 may be disposed to directly face the lower surface of the third device 116.

As described above, the package substrate in the first embodiment forms a post bump 117 connected to the main board 200 under the printed circuit board, and the main board and the printed circuit board may be electrically connected to each other by using the post bump 117. In addition, the lower surface of the second molding layer 110 disposed under the printed circuit board is positioned on the same plane as the lower surface of the third device 116, and it is possible to solve the non-contact problem between the printed circuit board and the main board.

FIG. 17 is a view showing a printed circuit board according to a second embodiment.

The printed circuit board 300 of FIG. 17 is different from the printed circuit board of FIG. 2 in that the post bumps have a vertically symmetrical structure.

That is, in the printed circuit board according to the first embodiment, the post bump 117 is disposed only on a lower portion of the printed circuit board.

Alternatively, in the printed circuit board according to the second embodiment, post bumps may be respectively disposed on both surfaces of the printed circuit board.

Referring to FIG. 17, the printed circuit board 300 includes a first insulating layer 301, a circuit pattern 302, a via 303, a second insulating layer 303, a third insulating layer 304, a first pad 306, a second pad 307, a protective layer 308, a first molding layer 309, a second molding layer 310, a first connection portion 311, a first device 312, a second connection portion 313, a second device 314, a third connection portion 315, a third device 316, and post bumps 317 and 318.

The first insulating layer 301 may be a core substrate.

The first insulating layer 301 may be a support substrate of a printed circuit board on which a single circuit pattern is formed, but may also mean a region on which any one circuit pattern is formed among substrates having a plurality of stacked structures.

A second insulating layer 304 is formed on the first insulating layer 301, and a third insulating layer 305 is formed below the first insulating layer 301.

The first to third insulating layers 301, 304, and 305 form an insulating plate, and may be a thermosetting or thermoplastic polymer substrate, a ceramic substrate, an organic-inorganic composite material substrate, or a glass fiber impregnated substrate, and it may include an epoxy-based insulating resin such as FR-4, BT (Bismaleimide Triazine), and ABF (Ajinomoto Build up Film) in the case of including a polymer resin, and alternatively, it may include a polyimide-based resin, but is not particularly limited thereto.

The first to third insulating layers 301, 304, and 305 may be formed of different materials. For example, the first insulating layer 301 is an impregnated substrate including glass fibers, and the second and third insulating layers 304 and 305 may be insulating sheets made of only resin.

An internal circuit pattern 302 is formed on at least one of upper and lower portions of the first insulating layer 301.

In addition, a via 303 is formed in the first insulating layer 301 to connect the internal circuit patterns 302 formed in different layers.

External circuit patterns (not shown) are also formed on the second insulating layer 304 formed on the first insulating layer 301 and the third insulating layer 305 formed under the first insulating layer.

External circuit patterns (not shown) are also formed on exposed surface of the second insulating layer 304 formed on the first insulating layer 301 and the third insulating layer 305 formed under the first insulating layer.

The external circuit pattern may mean the pads 306 and 307 shown in the drawing. That is, the external circuit pattern is formed by the same process as the pads 306 and 307, and is divided into a pattern and a pad according to their function.

That is, a circuit pattern is formed on the surfaces of the second insulating layer 304 and the third insulating layer 305, according to the function of the circuit pattern, a part may be an external circuit pattern, and the other part may be the pads 306 and 307 connected to a chip or other substrate.

Also, vias are formed in the second insulating layer 304 and the third insulating layer 305.

The via 303 as described above forms a via hole for opening at least one of the first, second, and third insulating layers 301, 304, and 305 through a laser process, and accordingly, it may be formed by filling the inside of the formed via hole with a metal paste.

In this case, the metal material forming the via 303 may be any one material selected from Cu, Ag, Sn, Au, Ni and Pd, and the metal material may be filled using any one or a combination of electroless plating, electrolytic plating, screen printing, sputtering, evaporation, inkjetting and dispensing.

A protective layer 108 is formed on the surfaces of the second insulating layer 304 and the third insulating layer 305 (a surface exposed to the outside, a surface on which the pad is formed).

The protective layer 308 has an opening exposing upper surfaces of the first pad 306 and the second pad 307.

That is, the protective layer 308 is to protect the surfaces of the second insulating layer 304 and the third insulating layer 305, and the front surface of the second insulating layer 304 and the third insulating layer 305. It has an opening for opening the surface of the stacked structure of the first pad 306 and the second pad 307 to be exposed.

The protective layer 308 may be formed of at least one layer using any one or more of Solder Resist (SR), oxide, and Au. Preferably, the protective layer 308 may be a solder resist.

The first pad 306 exposed by the opening of the protective layer 308 is classified according to its function.

That is, the first pad 306 may include a pad connected to the first device 312, a pad connected to the second device 314, and a pad connected to the second post bump 318.

To this end, connecting portions 311 and 313 may be disposed on the first pad 306. That is, the first connection portion 311 may be disposed on a pad on which the first device 312 is mounted among the first pads 306. Also, a second connection portion 313 may be disposed on a pad on which the second device 314 is mounted among the first pads 306.

The first device 312 may be attached on the first connection portion 311. In addition, the second device 314 may be attached to the second connection portion 313.

In addition, a second post bump 318 may be disposed on the first pad 306.

A first molding layer 309 is disposed on the upper protective layer or the first protective layer among the protective layer 308. The first molding layer 309 may be disposed on the upper protective layer or the first protective layer to cover the first device 312 and the second device 314. The first molding layer 309 may be formed of resin. The first molding layer 309 can protect the first device 312 and the second device 314 from an external environment by molding the first device 312 and the second device 314 therein. An upper surface of the first molding layer 309 may be positioned higher than upper surfaces of the first device 312 and the second device 314. For example, the upper surface of the first device 312 and the upper surface of the second device 314 may be disposed to cover the upper surface of the first molding layer 309.

A lower surface of the second post bump 318 may directly contact an upper surface of the first pad 306. In addition, a side surface of the second post bump 318 may include a first portion in direct contact with the first protective layer or the upper protective layer, and a second portion in direct contact with the first molding layer 309.

Meanwhile, the second pad 307 is disposed on the lower surface of the third insulating layer 305. In addition, the second pad 307 may include a mounting pad on which the third device 316 is mounted, and a bump pad on which a first post bump 317 for connection to an external main board is disposed.

A third connection portion 315 may be disposed on the mounting pad of the second pad 307.

The first post bump 317 may be disposed under the lower protective layer or the second pad 307 exposed through the second protective layer or a lower surface of the bump pad.

The first post bump 317 may protrude from the lower surface of the lower protective layer or the second protective layer. The first post bump 317 may have the same upper width and the same lower width. In addition, the first post bump 317 may have an upper width and a different lower width. The first post bump 317 may have a pillar shape.

In this case, the lower surface of the first post bump 317 may be positioned higher than the lower surface of the third device 316.

A second molding layer 310 is disposed under the lower protective layer or the second protective layer among the protective layers 308. The second molding layer 310 may be disposed on the lower protective layer or the second protective layer to cover the third device 316. The second molding layer 310 may be formed of resin. In this case, the second molding layer 310 may be disposed to cover a side portion of the third device 316. Also, the second molding layer 310 may be disposed to expose a lower surface of the third device 316. In other words, the lower surface of the second molding layer 310 may be positioned on the same plane as the lower surface of the third device 316. In this case, the lower surface of the second molding layer 310 is the same as the lower surface of the third device 316. In the case, in a state in which the second molding layer 310 is formed to cover the lower surface of the third device 316, it may be formed by grinding the second molding layer 310 so that the lower surface of the second molding layer 310 is positioned on the same plane as the lower surface of the third device 116.

As described above, the printed circuit board 300 according to the second embodiment includes a first molding layer 309 for molding devices mounted on the insulating layers 301, 304, and 305. In addition, the printed circuit board 300 according to the second embodiment includes a second molding layer 310 for molding devices mounted under the insulating layers 301, 304, and 305. As such, in the printed circuit board 300, the molding layer is not disposed on only one side of the insulating layer, but the molding layer is disposed on both sides, thereby, it is possible to maintain the balance of both sides of the printed circuit board, and accordingly, it is possible to minimize the occurrence of warpage.

In addition, the printed circuit board 300 according to the second embodiment forms post bumps 318 and 317 disposed on the first pad 306 and the second pad 307 to have a symmetrical structure to each other. In this way, the post bumps are not arranged on only one side of the printed circuit board 300 with respect to the insulating layer, but the post bumps are arranged on both sides, and it is possible to maintain the balance of both sides of the printed circuit board, and accordingly, it is possible to minimize the occurrence of warpage.

In addition, the first and second post bumps 317 and 318 may have the structures described with reference to FIGS. 5 to 7, and accordingly, it is possible to improve the fracture resistance due to external physical and internal lamination pressure.

FIG. 18 is a view showing a package substrate according to the second embodiment.

Referring to FIG. 18, the package substrate according to the second embodiment includes the printed circuit board 300 described with reference to FIG. 17.

In addition, a first solder ball 410 may be disposed on a lower surface of the first post bump 317 of the printed circuit board 300.

In addition, a second solder ball 510 may be disposed on the upper surface of the second post bump 318 of the printed circuit board 300.

In addition, the main board 400 may be attached under the first post bump 317 by the first solder ball 410. That is, a pad (not shown) in contact with the first solder ball 210 may be disposed on the upper surface of the main board 400 while being aligned with the first post bump 317.

In this way, the package substrate in the second embodiment forms a first post bump 317 connected to the main board 400 under the printed circuit board, and the main board and the printed circuit board may be electrically connected to each other using the first post bump 317. In addition, the lower surface of the second molding layer 310 disposed under the printed circuit board is positioned on the same plane as the lower surface of the third device 316, and it is possible to solve a non-contact problem between the printed circuit board and the main board.

In addition, the upper package 500 may be attached on the second post bump 318 by the second solder ball 510.

According to this embodiment, a package substrate is manufactured by forming post bumps on a printed circuit board and attaching an upper package or a main board using the post bumps, accordingly, it is possible to respond to a fine pitch, and it can maximize the productivity of the manufacturer.

In addition, according to this embodiment, each device is mounted on both surfaces of the printed circuit board, and a molding layer for molding the mounted device is disposed. Accordingly, it is possible to maintain the balance of the upper and lower portions of the printed circuit board compared to the existing single-sided molding structure. Accordingly, it is possible to minimize the occurrence of warpage of the printed circuit board.

In addition, according to the embodiment, each device is mounted on both sides of the printed circuit board. Accordingly, all active or passive devices mounted on the existing upper package can be mounted on the printed circuit board, and accordingly, the overall thickness of the package substrate may be reduced.

In addition, according to the present embodiment, the lower surface of the molding layer to which the main board is attached is positioned on the same plane as the lower surface of the device mounted on a lower portion of the printed circuit board. Accordingly, the reliability of the connection between the main board and the printed circuit board can be improved.

In addition, according to the present embodiment, the post bumps are respectively disposed on both sides of the printed circuit board, and thereby, it is possible to improve the package balance compared to the existing single-sided post-bump arrangement structure, and accordingly, it is possible to minimize the occurrence of warpage.

In addition, according to the present embodiment, post bumps are respectively disposed on both surfaces of the printed circuit board, thereby, it is possible to dissipate heat to both sides of the printed circuit board through the post bump, and accordingly, heat dissipation characteristics may be improved.

In addition, according to the present embodiment, the height of the post bump can be adjusted as much as the height of the device, and thus the design of the package is easy.

In addition, according to an embodiment, the post bump can be formed on the pad by using the seed layer disposed under the pad without separately forming a seed layer for electroplating under the post bump. Accordingly, there is no need to form a separate seed layer for forming the post bump, and thereby, the manufacturing process can be simplified, and it is possible to solve the crack generation between the seed layer of the post bump, and accordingly, the reliability and durability of the product can be improved. In addition, according to the embodiment, it is not necessary to separately perform a desmear process on a solder resist, and thereby, the whitening phenomenon of the solder resist by a desmear solution can be prevented.

In addition, in the embodiment, an aspect ratio of the post bump is included in the range of 0.4 to 0.7, and thereby, the durability of the post bump can be improved.

The characteristics, structures and effects described in the embodiments above are included in at least one embodiment but are not limited to one embodiment. Furthermore, the characteristics, structures, effects, and the like illustrated in each of the embodiments may be combined or modified even with respect to other embodiments by those of ordinary skill in the art to which the embodiments pertain. Thus, it would be construed that contents related to such a combination and such a modification are included in the scope of the embodiments.

Embodiments are mostly described above, but they are only examples and do not limit the embodiments. A person skilled in the art to which the embodiments pertain may appreciate that several variations and applications not presented above may be made without departing from the essential characteristic of the embodiments. For example, each component particularly represented in the embodiments may be varied. In addition, it should be construed that differences related to such a variation and such an application are included in the scope of the embodiment defined in the following claims.

What is claimed is:

1. A circuit board comprising:

an outermost insulating layer;

a protective layer disposed on the outermost insulating layer;

a pad disposed between the outermost insulating layer and the protective layer and protruding from the outermost insulating layer; and a bump disposed on the pad;

wherein the pad includes a seed layer disposed on the outermost insulating layer, and an electroplating layer disposed on the seed layer and electroplated using the seed layer, wherein a horizontal width of the seed layer is greater than a horizontal width of the electroplating layer, wherein the seed layer includes a first portion vertically overlapping the electroplating layer and the bump, and a second portion vertically overlapping the protective layer and not overlapping the electroplating layer and the bump, wherein a top surface of the first portion of the seed layer is in contact with the electroplating layer, and a top surface of the second portion of the seed layer is in contact with the protective layer, wherein the first portion of the seed layer and the second portion of the seed layer are spaced apart from each other in a horizontal direction, and wherein a spaced region between the first portion of the seed layer and the second portion of the seed layer does not vertically overlap the electroplating laver, the bump, and the protective layer.

2. The circuit board of claim 1, wherein the seed layer further includes a third portion vertically overlapping the electroplating layer and not overlapping the bump and the protective layer.

3. The circuit board of claim 2, wherein a first thickness of the seed layer is smaller than a second thickness of the electroplating layer, wherein the second thickness of the electroplating layer is smaller than a third thickness of the bump.

4. The circuit board of claim 2, wherein the protective layer includes a first opening, and a second opening, wherein the bump is disposed in the first opening, wherein a top surface of the outermost insulating layer is exposed through the second opening of the protective layer.

5. The circuit board of claim 1, wherein the bump includes a through portion passing through the protective layer, and a protrusion that is disposed on the through portion, wherein a horizontal width of the protrusion is greater than a horizontal width of the through portion.

6. The circuit board of claim 1, wherein the horizontal width of the seed layer is greater than a horizontal width of the bump.

7. The circuit board of claim 1, wherein the seed layer further includes a third portion disposed between the first portion and the second portion, and wherein a top surface of the third portion of the seed layer does not vertically overlap the electroplating layer, the bump, and the protective layer.

8. A circuit board comprising:

an outermost insulating layer;

a protective layer disposed on the outermost insulating layer;

a pad disposed between the outermost insulating layer and the protective layer and protruding from the outermost insulating layer; and a bump disposed on the pad;

wherein the pad includes a seed layer disposed on the outermost insulating layer, and an electroplating layer disposed on the seed layer and electroplated using the seed layer, wherein a horizontal width of the seed layer is greater than a horizontal width of the electroplating layer, wherein the seed layer includes:

a first portion vertically overlapping the electroplating layer and the bump, a second portion vertically overlapping the protective layer and not overlapping the electroplating layer and the bump, and a third portion disposed between the first portion and the second portion, vertically overlapping the electroplating layer and not overlapping the bump and the protective layer, wherein top surfaces of the first portion and the third portion of the seed layer are in contact with the electroplating layer, and a top surface of the second portion of the seed layer is in contact with the protective layer.

9. The circuit board of claim 8, wherein the second portion of the seed layer is in direct contact with the protective layer.

10. The circuit board of claim 9, wherein the bump includes a through portion passing through the protective layer, and a protrusion that is disposed on the through portion, wherein a horizontal width of the protrusion is greater than a horizontal width of the through portion.

11. The circuit board of claim 8, wherein a horizontal width of the seed layer is greater than a horizontal width of the bump.

12. The circuit board of claim 8, wherein the first portion of the seed layer and the third portion of the seed layer are connected to each other, wherein the second portion of the seed layer are spaced apart from the first portion and the third portion in a horizontal direction.

13. The circuit board of claim 8, wherein the second portion of the seed layer is electrically connected to the first portion and the third portion of the seed layer.

14. The circuit board of claim 13, wherein the protective layer includes a first opening, and a second opening, wherein the bump is disposed in the first opening, wherein a top surface of the outermost insulating layer is exposed through the second opening of the protective layer.

15. A semiconductor package:

a circuit board according to claim 14; and a molding layer disposed on the circuit board, wherein the outermost insulating layer includes a top surface and a bottom surface, wherein the molding layer is disposed on the top surface of the outermost insulating layer, and wherein the molding layer includes protrusion disposed in the second opening of the protective layer.

16. The semiconductor package of claim 15, further comprising:

a semiconductor device disposed on the bump.

17. The circuit board of claim 8, wherein a first thickness of the seed layer is smaller than a second thickness of the electroplating layer, wherein the second thickness of the electroplating layer is smaller than a third thickness of the bump.

* * * * *